United States Patent
Yuzurihara et al.

(10) Patent No.: US 8,169,162 B2
(45) Date of Patent: May 1, 2012

(54) ABNORMAL DISCHARGE SUPPRESSING DEVICE FOR VACUUM APPARATUS

(75) Inventors: Itsuo Yuzurihara, Zama (JP); Atsushi Takayanagi, Kamakura (JP)

(73) Assignee: Kyosan Electric Mfg. Co., Ltd., Yokohama-shi, Kanagawa (JP)

(*) Notice: Subject to any disclaimer, the term of this patent is extended or adjusted under 35 U.S.C. 154(b) by 288 days.

(21) Appl. No.: 12/670,265

(22) PCT Filed: Jul. 14, 2008

(86) PCT No.: PCT/JP2008/062666
§ 371 (c)(1),
(2), (4) Date: Jan. 22, 2010

(87) PCT Pub. No.: WO2009/118920
PCT Pub. Date: Oct. 1, 2009

(65) Prior Publication Data
US 2010/0187998 A1 Jul. 29, 2010

(30) Foreign Application Priority Data
Mar. 26, 2008 (JP) .................................. 2008-080863

(51) Int. Cl.
*H05B 37/02* (2006.01)
(52) U.S. Cl. ........ 315/308; 315/291; 315/344; 315/360; 315/111.21; 118/723 R; 118/723 VE; 118/723 MW; 713/320; 713/340
(58) Field of Classification Search ............. 315/111.21, 315/224, 344, 291, 307, 308, 360; 118/723 R, 118/723 VE, 723 MW, 723 E, 723 I, 723 ME; 713/320, 322, 340
See application file for complete search history.

(56) References Cited

U.S. PATENT DOCUMENTS
6,184,687 B1 * 2/2001 Yamage et al. ............... 324/464
(Continued)

FOREIGN PATENT DOCUMENTS
JP 55-145171 A 11/1980
(Continued)

OTHER PUBLICATIONS

Office Action dated Mar. 4, 2011, issued in corresponding Korean Patent Application No. 10-2010-7000990.
(Continued)

*Primary Examiner* — Haiss Philogene
(74) *Attorney, Agent, or Firm* — Westerman, Hattori, Daniels & Adrian, LLP

(57) ABSTRACT

The present invention is directed to an apparatus for suppressing abnormal electrical discharge used for vacuum equipment which supplies power from a high-frequency power source to a plasma reaction chamber and executes a film formation process, provided with a power controller for controlling the high-frequency power source based on a deviation between a power command value and a power feedback value, and a cutoff controller for cutting off the power supply from the high-frequency power source to the plasma reaction chamber, based on a detection of the abnormal electrical discharge within the plasma reaction chamber. The cutoff controller exercises a first handling cutoff control and a second handling cutoff control, each having a different cutoff time. The first handling cutoff allows ions to remain in the plasma reaction chamber, and exercises the cutoff control over the high-frequency power source within a time duration which allows an arcing element to disappear. On the other hand, the second handling cutoff control exercises cutoff control over the high-frequency power source within a time range which allows abnormal arc ions to disappear. Accordingly, it is possible to supply power to plasma stably.

32 Claims, 14 Drawing Sheets

U.S. PATENT DOCUMENTS

| | | | |
|---|---|---|---|
| 6,253,703 B1* | 7/2001 | Echizen et al. | 118/723 ME |
| 6,841,124 B2* | 1/2005 | Chien et al. | 422/3 |
| 8,032,770 B2* | 10/2011 | Choi | 713/320 |
| 2004/0244693 A1* | 12/2004 | Ishii et al. | 118/723 MW |
| 2005/0040144 A1 | 2/2005 | Sellers | |
| 2006/0011591 A1 | 1/2006 | Sellers | |
| 2007/0121267 A1 | 5/2007 | Kotani et al. | |

FOREIGN PATENT DOCUMENTS

| | | |
|---|---|---|
| JP | 06-119997 A | 4/1994 |
| JP | 8-167500 A | 6/1996 |
| JP | 2733454 B2 | 3/1998 |
| JP | 11-323529 A | 11/1999 |
| JP | 2000-299198 A | 10/2000 |
| JP | 2001-102196 A | 4/2001 |
| JP | 2004-006147 A | 1/2004 |
| JP | 2007-503096 A | 2/2007 |
| JP | 2007-149596 A | 6/2007 |
| JP | 2008-047292 A | 2/2008 |
| WO | 2005/057993 A1 | 6/2005 |

OTHER PUBLICATIONS

Notification of Transmittal of Copies of Translation of the International Preliminary Report on Patentability (Form PCT/IB/338) of International Application No. PCT/JP2008/062666 mailed Nov. 18, 2010 with Forms PCT/IB1373 and PCT/ISA/237.

International Search Report of PCT/JP2008/062666, mailing date of Oct. 21, 2008.

Written Opinion (PCT/ISA/237) for PCT/JP2008/062666, mailing date of Oct. 21, 2008 and English translation.

* cited by examiner

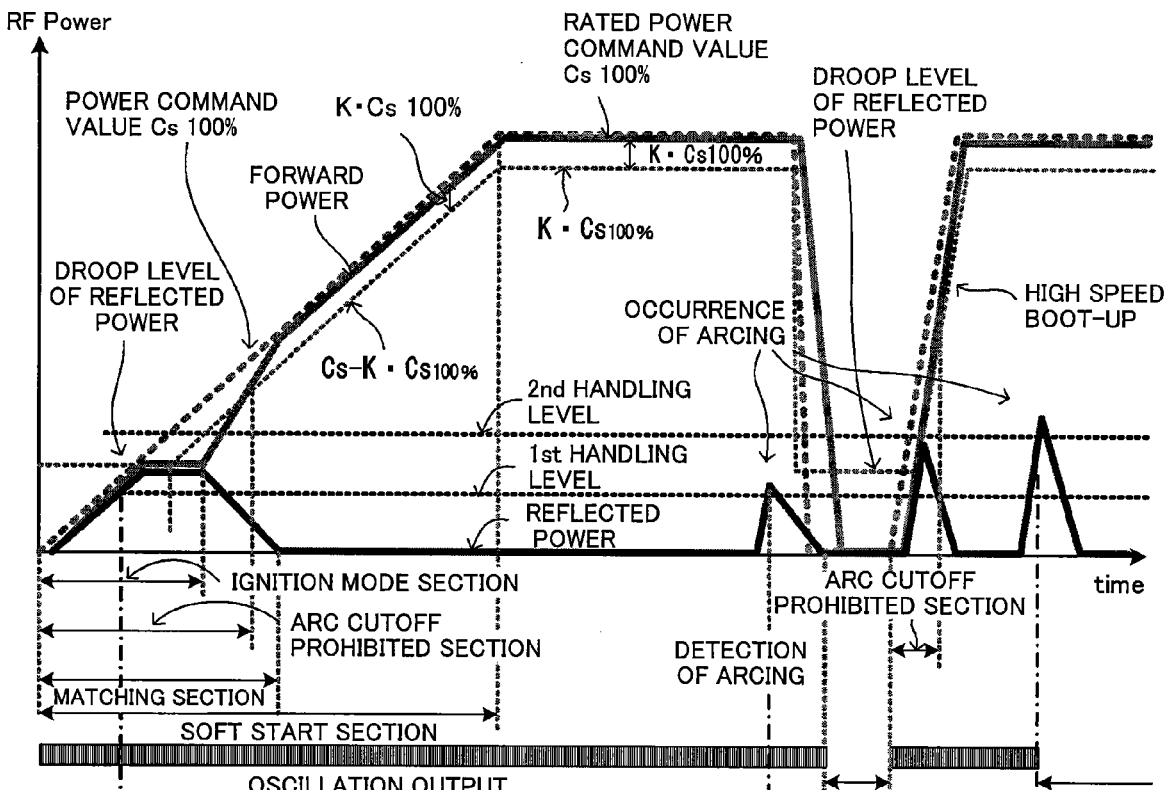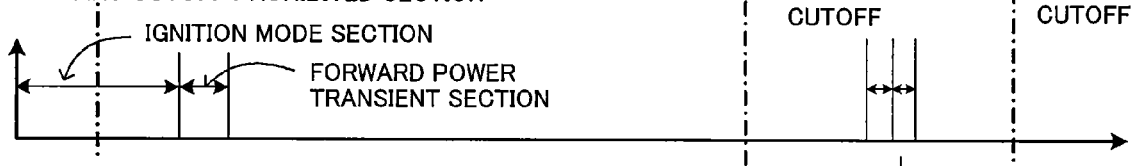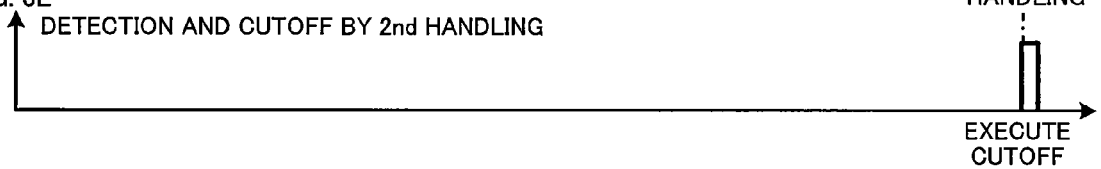

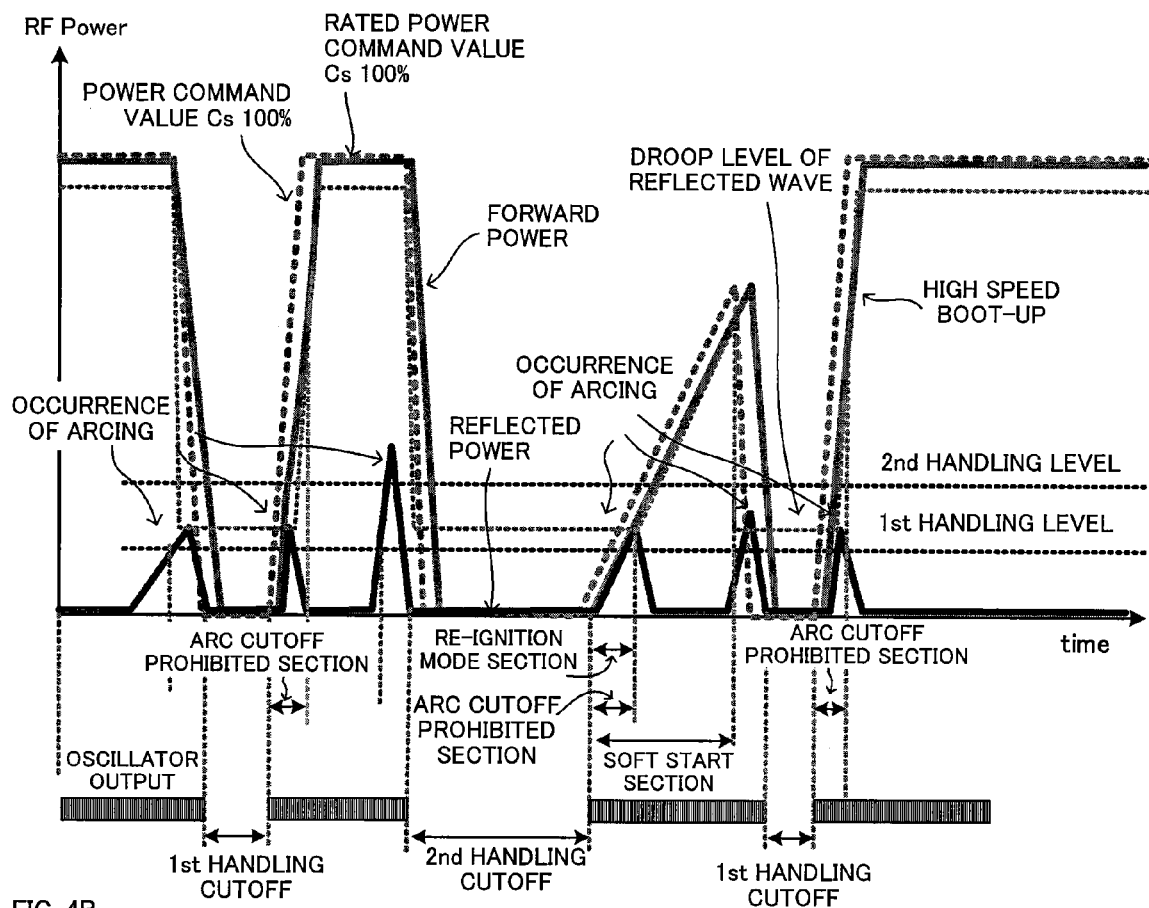
FIG. 4A
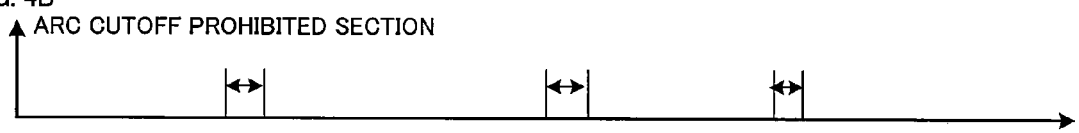
FIG. 4B ARC CUTOFF PROHIBITED SECTION
FIG. 4C DETECTION BY 1st HANDLING
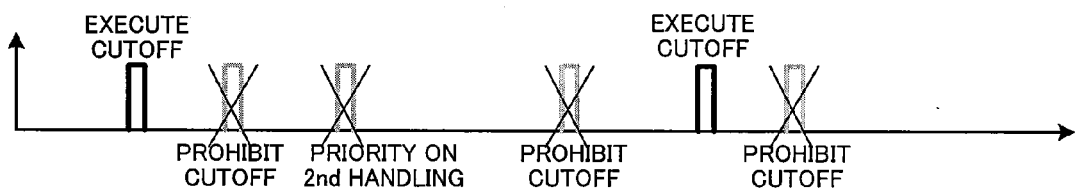
FIG. 4D CUTOFF BY 1st HANDLING
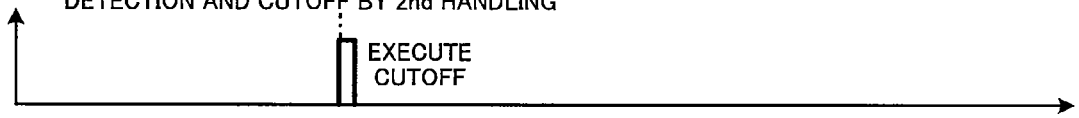
FIG. 4E DETECTION AND CUTOFF BY 2nd HANDLING

ABNORMAL DISCHARGE SUPPRESSING DEVICE FOR VACUUM APPARATUS

TECHNICAL FIELD

The present invention relates to an apparatus for suppressing abnormal electrical discharge in vacuum. More particularly, it relates to an apparatus for suppressing abnormal electrical discharge used for vacuum equipment, which cuts off an output from a high-frequency power source so as to suppress abnormal electrical discharge that may occur when plasma is generated by using the high-frequency power source. According to the suppression of the abnormal electrical discharge, a substrate can be protected from damage owing to such anomalous discharge, in film formation on the substrate or etching of the substrate by using plasma.

BACKGROUND ART

In a process of manufacturing an item such as a semiconductor device, a liquid crystal panel, and a disk, there is a step for subjecting a substrate of each item to a treatment using plasma. In a system which performs such plasma treatment step, high-frequency power is supplied from the high-frequency power source to change processed gas into plasma, and using this plasma, a surface of the substrate is subjected to a film formation or an etching treatment. In such system in vacuum, a matching circuit is provided between the high-frequency power source and a load, so as to adjust impedance reaching the plasma from the matching circuit and impedance reaching the high-frequency power supply from the matching circuit, thereby exercising control for suppressing a reflected power from the plasma.

In a treatment which employs plasma such as the film formation and etching, an abnormal electrical discharge may take place due to various factors, such as an arrangement of magnet part, a state of cathode surface, a method for manufacturing an insulated part; a quality of target, a manufacturing method, a shape of edge part, erosion, a surface corrosion state, and homogeneities of surface activation, and a temperature control method thereof; and a type of sputter gas, a pressure control thereof, and a way how to flow the gas.

As for the abnormal electrical discharge, initially, a minority arc is generated, and subsequently, energy is concentrated due to a temperature rise at the minority arc part, and then a transition is made to a majority abnormal discharge (a majority arc). When this majority arc is generated, a positive feedback occurs in movement of high-energy electron, a rise of the surface temperature of the target, and an abnormal distribution of gas pressure. Accordingly, evaporation of the target material and rising of local plasma density occur, resulting in triggering of an enormous arc, referred to as "racetrack arc", for instance. Such minority arc, majority arc, and racetrack arc may physically destroy the target, and in addition to such influence, there is another influence brought about by broken pieces, such as making of pinhole on a memory or on an optical surface in the course of film formation.

When a small oxidized portion is generated on the target due to the destruction, an electron density at the portion becomes higher, and energy accumulated in the plasma itself and additional energy supplied from the high-frequency power source and DC power source are absorbed. Accordingly, impedance around the oxidized portion is radically lowered, and the energy being absorbed is converted into heat. This heat causes evaporation of the material of the target, thereby increasing a partial pressure or making the electron density higher. Therefore, if such major-scale abnormal electrical discharge occurs as described above, it is necessary to release the heat around the target or sample, and apply the power again, after diffusion of gas (see patent document 1).

The electron density within plasma is one of the factors which exert influence on a substrate treatment. The state of plasma is changed according to high-frequency power, pressure within a vacuum chamber, or the like. Therefore, even though the impedance is adjusted by the matching circuit, some plasma conditions may increase a reflected wave, which is reflected by the plasma and returns to the high-frequency power source. There is suggested a technique which monitors the electron density within the plasma, by detecting a reflective coefficient (see patent document 2).

Occurrence of abnormal electrical discharge such as an arc may cause damage to a glass substrate, silicon wafer, or the like. It is suggested that when the arc occurs within a plasma generation chamber in a high-frequency generator, the occurrence of arc is detected by detecting a reflected power, and a control circuit which receives a detection signal lowers or suspends temporarily (for tens of millisecond) the output from the high-frequency generator, thereby achieving arc suppression (see patent document 3).

In order to suppress instantaneous abnormal electrical discharge which occurs on an electrode for film formation, a plasma CVD device is suggested, which is provided with an operational feature, referred to as arc-cut function to suppress the occurrence of abnormal electrical discharge. This arc-cut function detects a sign of occurrence of instantaneous abnormal electrical discharge, according to current or the like within a matching box, and stops application of high-frequency power or reduces the applied power, only for a short period of time (see patent document 4).

The patent document 3 further suggests that the number of arc-cut operation times is counted, so as to record the number of arc-cut operation times during film formation treatment.

[Patent Document 1]
Japanese Patent Application Publication No. 2733454
[Patent Document 2]
Japanese Unexamined Patent Application Publication No. 2000-299198
[Patent Document 3]
Japanese Unexamined Patent Application Publication No. 06-119997
[Patent Document 4]
Japanese Unexamined Patent Application Publication No. 2001-102196

DISCLOSURE OF THE INVENTION

Problem to be Solved by the Invention

In vacuum equipment, occurrence of abnormal electrical discharge is detected, typically when a reflected power is rapidly increased. However, this reflected power may also be increased in the case other than the abnormal electrical discharge occurrence. Therefore, there is a problem that a high-frequency power source may be cut off, even though there is no abnormal electrical discharge. For example, at the time of ignition when the high-frequency power source is activated to supply the high-frequency power to the load side, the reflected power is increased. Accordingly, even when any abnormal electrical discharge does not occur, it is determined that the abnormal electrical discharge has occurred upon detecting the increase of the reflected power, and an output of high-frequency power from the high-frequency power source to the load side is controlled to be cut off. If the output from the high-frequency power source is cut off, power is not supplied, and therefore plasma is not formed, resulting in a trouble in the film formation treatment.

In addition to the time of the ignition as described above, there is a similar problem in the case where the high-frequency power source is restarted, after cutting off the output of the high-frequency due to the detection of the abnormal electrical discharge. On this occasion, since the reflected power is increased owing to mismatching of impedance or the like, the increase of the reflected power may cause a false detection that the abnormal electrical discharge has occurred, even when such discharge has not occurred. Therefore, the cutoff operation is carried out once again, and this may develop a trouble in restarting.

It is conceivable that at the time of ignition or restarting, a detection level for detecting the abnormal electrical discharge is set to be higher, and accordingly such false detection may be suppressed. However, typically, the high-frequency power source has a protective feature of drooping characteristic which lowers the output voltage to be protected against overcurrent. Therefore, it is necessary to set the detection level sufficiently higher (e.g., 20% to 50%) than the droop level (e.g., 15%) of the reflected power. If the detection level for detecting the abnormal electrical discharge is set to such a high level, it becomes difficult to detect the abnormal electrical discharge at an initial stage, and there is a problem that favorable detection of the abnormal electrical discharge is disabled.

On the other hand, if the detection level is set to be low for detecting the abnormal electrical discharge during a steady plasma operation, ions are likely to remain. If the remaining ions are accumulated, those ions may cause an abnormal arc generation, and the abnormal electrical discharge more likely to occur. Therefore, there is a problem that it becomes difficult to supply power to the plasma stably.

Accordingly, an object of the present invention is to solve the conventional problems as described above, and to supply power stably to the plasma.

It is an object of the present invention to suppress a growth of arc and to eliminate the accumulation of ions which cause an abnormal arc to occur.

It is another object of the present invention to reduce a false detection of abnormal electrical discharge, in order to achieve a stable power supply to the plasma.

It is still another object of the present invention to suppress the false detection, without setting a high detection level for detecting the abnormal electrical discharge, at the time of ignition or restarting, in order to achieve a stable power supply to the plasma.

Means to Solve the Problem

The apparatus for suppressing abnormal electrical discharge used for vacuum equipment according to the present invention suppresses the abnormal electrical discharge for stably supplying electric power to plasma, and there are two aspects of the present invention for suppressing occurrence of the abnormal electrical discharge.

A first aspect of the present invention for suppressing the abnormal electrical discharge is directed to making appropriate use of a first handling cutoff control and a second handling cutoff control: In the first handling cutoff control, a duration of cutoff time for breaking the output from the high-frequency power source is prepared variously, thereby enabling a restart in the state where ions within plasma still remain, and in the second handling cutoff control, the restart is performed in the state where abnormal arc ions have disappeared.

A second aspect of the present invention is directed to suppressing a malfunction due to a false detection of abnormal electrical discharge, by prohibiting the cutoff operation during a section where a feedback signal is vulnerable to fluctuations, for example, at a time of ignition or at a time of restarting by high speed boot-up which is performed after the first handling cutoff control. Both the first aspect and the second aspect of the invention enable the stable power supply to the plasma.

In the first aspect of the invention, the first handling cutoff control enables restarting in the state where ions still remain in the plasma, thereby suppressing a growth of arc, and the second handling cutoff control restarts in the state where abnormal arc ions have disappeared, thereby eliminating accumulation of ions which may generate the abnormal arc.

In the second aspect of the invention, in the section at the ignition time, at the restarting time after the first handling cutoff, or the like, the cutoff operation is prohibited even though an abnormal electrical discharge is detected.

The first aspect of the present invention is directed to an apparatus for suppressing abnormal electrical discharge used for vacuum equipment which supplies power from a high-frequency power source into a plasma reaction chamber to generate plasma and performs treatment such as film formation and etching by using plasma, the apparatus incorporating a power controller for controlling the high-frequency power source based on a deviation between a power command value and a power feedback value, and a cutoff controller for cutting off a power supply from the high-frequency power source to the plasma reaction chamber based on a detection of reflected power or reflected wave voltage which is generated at least any one of followings; at a time of abnormal electrical discharge and during a transfer process to the abnormal electrical discharge within the plasma reaction chamber.

The cutoff controller performs the first handling cutoff control and the second handling cutoff control, each having a cutoff time being different. The first handling cutoff control allows ions to remain within the plasma reaction chamber, and exercises control to cut off the high-frequency power source within a time duration which allows an arcing element of a minority arc disappear, being a factor of the abnormal electrical discharge. On the other hand, the second handling cutoff control exercises control to cut off the high-frequency power source within a time duration which allows the ions to disappear, the ions of a majority arc at the time of abnormal electrical discharge.

In the first handling cutoff control, the cutoff time duration is set to be short, for example, from 1 μs to 100 μs, and the cutoff control is terminated in the state where the ions still remain within the plasma reaction chamber. Since the arcing element of the minority arc disappears by the end of this short time cutoff, the abnormal electrical discharge can be eliminated. Since ions within the plasma reaction chamber still remain in the cutoff time duration by the first handling cutoff control, when restarting is executed after the cutoff, the power supply can be booted up immediately within a short period of time. Accordingly, it is possible to resume normal discharge instantaneously.

In the second handling cutoff control, the time duration is set to be from 1 ms to 100 ms, for example, and the cutoff control is terminated in the state where the abnormal arc ions of majority arc have disappeared. Accordingly, accumulation of ions which may generate the abnormal arc is eliminated, thereby cutting off arcing.

Since the second handling cutoff makes the abnormal arc ions to disappear, it is also referred to as an "arc ion refresh operation".

In the first aspect of the invention, the power controller performs restarting for high speed boot-up after the first handling cutoff control cuts off outputting from the high-frequency power source, and exercises a feedback control over a forward power value or a traveling wave voltage value, with respect to the power command value or the voltage command value, thereby controlling an output from the high-frequency power source to be equal to the power command value or the voltage command value.

The high speed boot-up after the first handling cutoff control outputs ramped power or voltage from zero to the power command value or the voltage command value, within a duration with the same time ordering as the cutoff time of the first handling cutoff control. Therefore, the time duration required for the high speed boot-up can be determined based on the cutoff time of the first handling cutoff control. This high speed boot-up time duration may be defined as a value from 1 μs to 100 μs, for instance.

In addition, the power controller performs restarting according to a soft start function, after the second handling cutoff control cuts off the output from the high-frequency power source, and exercises the feedback control over the forward power value or the traveling wave voltage value, with respect to the power command value or the voltage command value, thereby controlling the output from the high-frequency power source to be equal to the power command value or the voltage command value.

The soft start function is performed after the second handling cutoff control at a matching speed which allows a matching circuit of a matching box, provided between the high-frequency power source and the plasma reaction chamber, to sufficiently handle the ramped power output or voltage output; from zero to the power command value or the voltage command value. Therefore, the time duration required for the soft start can be defined depending on a magnitude of the power command value or the voltage command value, a matching property of the matching circuit of the matching box, or the like. This duration of the soft start may be set to 1 ms to 10 s, for instance.

The second handling cutoff control aims at eliminating accumulation of ions which may generate an abnormal arc, being a majority wave arc, and cutting off the arching. Therefore, it is effective to execute this control at the stage where the ions which may generate the abnormal arc in plasma have already been accumulated.

The present invention determines an accumulation state of the ions which may generate the abnormal arc, based on the cumulative number of executions of the first handling cutoff control, which is performed within a predetermined unit time (e.g., 10 ms). When the cumulative number of executions of the first handling cutoff control reaches a preset number of times, that point of time is determined as a stage where the ions which may generate the abnormal arc have been accumulated in plasma, and the second handling cutoff control is executed. A cutoff control prohibition part counts the number of executions of the first handling cutoff control within a first predetermined time, and when the value of count obtained by the counting reaches the preset number of times, the second handling cutoff control is executed.

The value of count is cleared simultaneously with executing the second handling cutoff control, and counting of the number of executions of the first handling cutoff control is resumed. Again, when the value of count reaches the preset number of times within the predetermined period of time, the second handling cutoff control is executed. By repeating the first handling cutoff control performed for the preset number of times and the second handling cutoff control subsequently performed, it is possible to suppress a growth of the arc, and eliminate the abnormal arc ions, effectively.

In the second aspect of the present invention, the cutoff operation is prohibited, even when abnormal electrical discharge is detected in the ignition mode section, the high speed boot-up section after the first handling cutoff, the re-ignition mode section after the second handling cutoff, or the like. Accordingly, a cutoff operation due to a false detection of the abnormal electrical discharge is suppressed, and power supply to the plasma can be stabilized. At the time of ignition or restarting after the cutoff, there is no match between the power and the plasma load, and this may bring an upsurge in the reflected power. In order to suppress overvoltage or overcurrent due to the upsurge in the reflected power, a reflected power drooping control is exercised. On this occasion, since the upsurge in the reflected power is caused by malfunction in matching, and not caused by an arc of abnormal electrical discharge, it is not necessary to perform the cutoff operation. Therefore, in the case as described above, the cutoff operation is prohibited, so as to stabilize the power supply to plasma.

The second aspect of the present invention is directed to a configuration of apparatus for suppressing abnormal electrical discharge in vacuum equipment which supplies power in a plasma reaction chamber to generate plasma and executes film formation or etching treatment by using the plasma, and this apparatus incorporates a high-frequency power source for supplying power. This high-frequency power source is provided with a power controller for controlling the high-frequency power source based on a deviation between a power command value and a power feedback value, and a cutoff controller for detecting a reflected power or a reflected wave voltage which is generated in at least any of the following timings; when the abnormal electrical discharge occurs in the plasma reaction chamber, and during a transfer process to the abnormal electrical discharge, and cutting off the power supply from the high-frequency power source to the plasma reaction chamber. The cutoff controller is provided with an arcing detection/cutoff part for detecting the abnormal electrical discharge, and a cutoff control prohibition part for prohibiting the power supply cutoff control according to the arcing detection/cutoff part.

The cutoff control prohibition part in the second aspect of the present invention prohibits the cutoff control of the power supply according to the cutoff controller, within the section which is defined as an arc cutoff prohibited section. Even when the cutoff controller controls to cut off the power supply, this cutoff control is prohibited and power supplying is still continued.

The power controller uses a forward power value as a power feedback value, and controls the output power to reduce a deviation between the power command value and the forward power value.

The cutoff controller exercises the cutoff control in two modes. The first mode is the first handling cutoff control for suppressing a minority arc, which detects abnormal electrical discharge by comparing reflected power or reflected wave voltage with a threshold value at a low level, and cuts off power supply according to the detection of the abnormal electrical discharge. The second mode is the second handling cutoff control for controlling a majority arc, which detects an increase of the reflected power by comparing the reflected power or reflected wave voltage with a threshold value at a high level, and cuts off power supply according to the detection of the increase of the reflected power.

The threshold value to be compared with the reflected power "Pr" is different in level, between the first handling cutoff control and the second handling cutoff control. The first handling cutoff control uses a low level value as the threshold value, and detects an initial stage in the increase of the reflected power or the reflected wave voltage. Accordingly, it is possible to detect the increase of the reflected power along with the abnormal electrical discharge occurrence.

On the other hand, the second handling cutoff control uses a high level value, which is higher than the low level value used in the first handling cutoff control, to detect and cut off a majority wave arc state, in which energy is concentrated and transition is made to majority abnormal discharge.

The cutoff control prohibition part of the present invention exercises the prohibition control for prohibiting the cutoff control to be effective in the first handling cutoff control, whereas this prohibition control is not executed in the second handling cutoff control. The first handling cutoff control allows plasma ions to remain, and simultaneously makes the arcing element of the minority arc to disappear. The second handling cutoff control aims at eliminating the majority arc ions at the time of abnormal electrical discharge, thereby suppressing the abnormal electrical discharge.

If the prohibition control for prohibiting the cutoff control is applied to the second handling cutoff control that is triggered by the abnormal electrical discharge, it may result in a deterioration of an effect which is produced by the second handling cutoff control. Therefore, the cutoff control prohibition part applies the prohibition control only to the first handling cutoff control, so as to prevent a false cutoff control due to a false detection of abnormal electrical discharge.

The arc cutoff prohibited section is a section where a mismatch occurs between the high-frequency power source and the plasma load. This section includes, an ignition mode section at the startup time of the high-frequency power source, a high speed boot-up section after the first handling cutoff upon restarting the high-frequency power source, a re-ignition mode section after the second handling cutoff, and a forward power transient section being a section until the traveling wave reaches a predetermined level.

In the arc cutoff prohibited section as described above, since the plasma is in unstable state and the matching circuit fails to provide a sufficient matching to the plasma load, there is a possibility that the reflected power is increased. The increase of the reflected power on this occasion is not caused by the abnormal electrical discharge. Since the high-frequency power source exercises drooping control over the increased reflected power as a protective operation, the cutoff control is not necessary in the arc cutoff prohibited section as described above. In the ignition mode section and the re-ignition mode section, it can be assumed that the plasma is ignited, and each of these sections corresponds to a section from when the forward power starts outputting power, until the power goes over the droop level of the reflected power.

In the ignition mode section and in the re-ignition mode section, if the forward power or the load power to the plasma deviates significantly, with respect to the power command value of the power outputted from the high-frequency power source, the drooping control is executed in receipt of excessive reflected power, and the drooping characteristic gives a protection against overvoltage and overcurrent. Since the power outputted from the high-frequency power source is reduced by the drooping characteristic, it is not necessary to stop the power supply by the cutoff control.

In the ignition mode section, in the re-ignition mode section, and in the high speed boot-up section, the first handling cutoff control erroneously detects the increase of the reflected power as abnormal electrical discharge, and according to this false detection, the power supply is cut off. Therefore, even though there is no occurrence of abnormal electrical discharge, supplying of power to the plasma is disabled. Considering the situation above, those sections are defined as the arc cutoff prohibited section, and the power supply is continued without cut off.

In the ignition mode section, in the re-ignition mode section, and in the high speed boot-up section, the droop level can be defined by "L×Cs 100%", which multiplies a command value of rated power "Cs 100%" by a reflected droop coefficient "L". Here, the reflected droop coefficient L can be defined within the range from 0.1 to 0.3.

At the time of startup or restarting, the forward power starts increasing, being delayed from the power command value "Cs", and gradually approaches the power command value Cs by the feedback control. If detection of the increase of the reflected power is determined as an abnormal electrical discharge in the section where this forward power is in transient state and the power supply is cut off based on this detection, supplying power to the plasma is disabled even though there is no occurrence of abnormal electrical discharge. Considering this situation, this forward power transient section is also assumed as the arc cutoff prohibited section, and the power supply is continued without cut off.

The forward power transient section has sufficiently large difference (Cs−Pf) between the forward power "Pf" and the power command value "Cs". This section can be defined according to a level range setting the power command value Cs as an upper limit, and setting (Cs−K×Cs 100%) as a lower limit, which is a value obtained by subtracting "K×Cs 100%" which multiplies the command value of rated power "Cs 100%" by a predetermined coefficient "K", from the power command value "Cs". When the forward power Pf is out of the level range, it is determined as currently in the arc cutoff prohibited section, and the power supply is continued without cut off. For example here, the coefficient K may be set within the range of 0.01 to 0.2, and it may be set to 0.03, for instance.

EFFECT OF THE INVENTION

As described above, according to the apparatus for suppressing abnormal electrical discharge used for vacuum equipment of the present invention, it is possible to supply power to plasma stably.

According to the apparatus for suppressing abnormal electrical discharge used for vacuum equipment of the present invention, a growth of arc can be suppressed, and accumulation of ions which may cause abnormal arc can be eliminated, thereby achieving a stable power supply to plasma.

Furthermore, according to the apparatus for suppressing abnormal electrical discharge used for vacuum equipment of the present invention, it is possible to reduce a false detection of abnormal electrical discharge, thereby achieving a stable power supply to plasma.

Furthermore, according to the apparatus for suppressing abnormal electrical discharge used for vacuum equipment of the present invention, it is possible to suppress a false detection, without setting a detection level for detecting the abnormal electrical discharge to a high level at the time of ignition or restarting, thereby achieving a stable power supply to plasma.

BRIEF DESCRIPTION OF DRAWINGS

FIG. 3 illustrates signal diagrams for explaining a cutoff process and a cutoff prohibition process according to the present invention;

FIG. 4 illustrates signal diagrams for explaining the cutoff process and the cutoff prohibition process according to the present invention;

DENOTATION OF REFERENCE NUMERALS

1 . . . POWER CONTROLLER
1a . . . POWER SETTING PART
1b . . . SOFT START CONTROLLER
1c, 1d . . . TRANSFER FUNCTION
1e . . . POWER SETTING PART
1f, 1g . . . POWER SETTING PART
2 . . . CUTOFF INTERRUPTION CIRCUIT
3 . . . CUTOFF CONTROLLER
4 . . . ARCHING DETECTION/CUTOFF PART
4A . . . FIRST HANDLING CUTOFF SYSTEM
4Aa . . . POWER SETTING PART
4Ab . . . FIRST COMPARATOR CIRCUIT
4Ac . . . FIRST CONTROL SIGNAL GENERATION CIRCUIT
4B . . . SECOND HANDLING CUTOFF SYSTEM
4Ba . . . POWER SETTING PART
4Bb . . . SECOND COMPARATOR CIRCUIT
4Bc . . . SECOND CONTROL SIGNAL GENERATION CIRCUIT
5 . . . CUTOFF CONTROL PROHIBITION PART
5a . . . FIRST SWITCH CIRCUIT
5b . . . THIRD COMPARATOR CIRCUIT
5c . . . SECOND SWITCH CIRCUIT
5d . . . DECISION CIRCUIT
5e . . . COUNTER CIRCUIT
6 . . . OSCILLATOR
7 . . . OPERATING AMPLIFIER
8 . . . POWER AMPLIFIER
9 . . . SENSOR
10 . . . HIGH-FREQUENCY POWER SOURCE
11 . . . MATCHING CIRCUIT
12 . . . PLASMA LOAD

BEST MODE FOR CARRYING OUT THE INVENTION

Here, preferred embodiments of the present invention will be explained in detail, with reference to the accompanying drawings.

Figure 1:
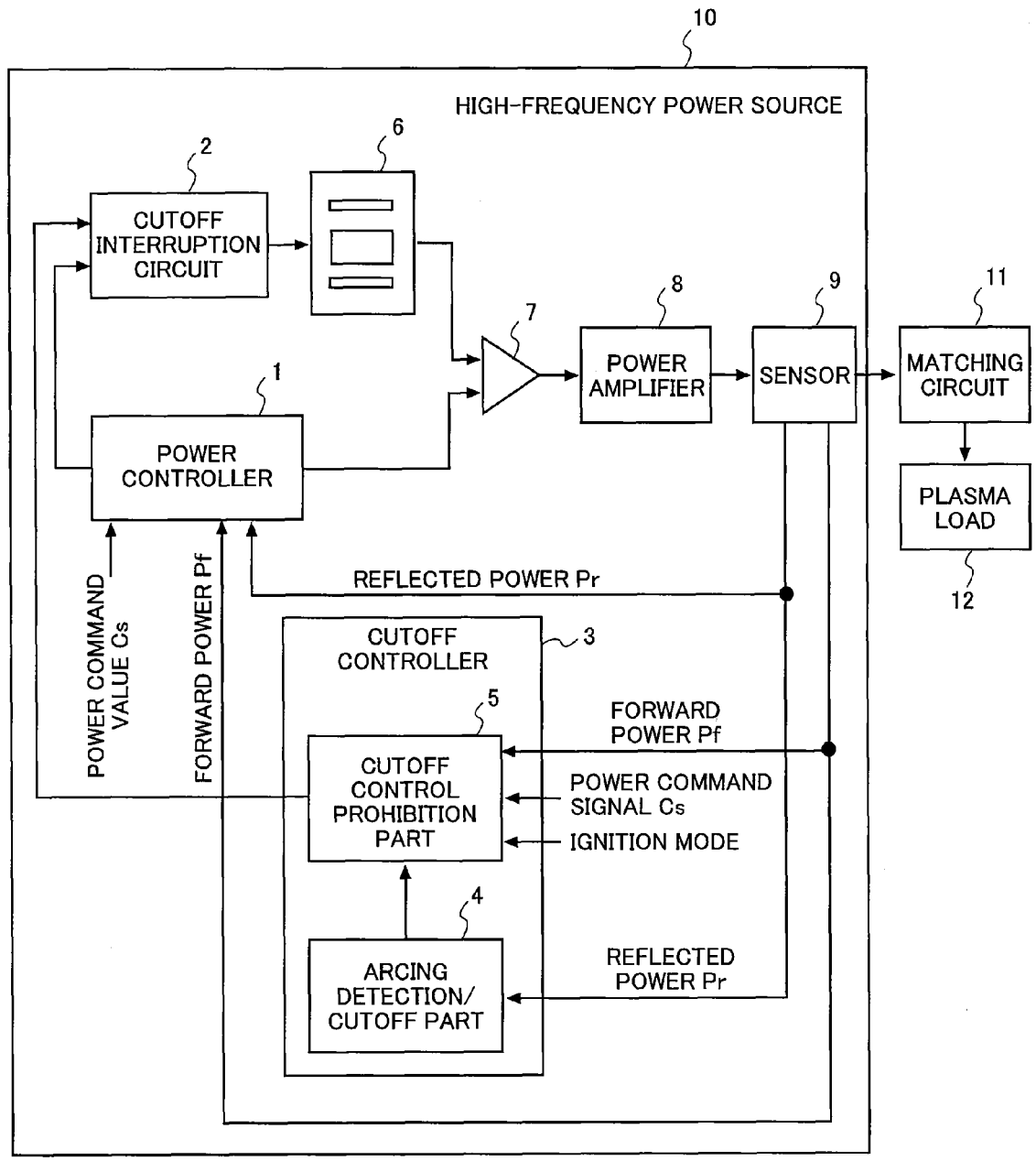
FIG. 1 illustrates a schematic configuration of a power source system of vacuum equipment and an apparatus for suppressing abnormal electrical discharge used for the vacuum equipment according to the present invention.

With reference to FIG. 1, an explanation will be made regarding a configuration example of the apparatus for suppressing abnormal electrical discharge used for vacuum equipment according to the present invention.

FIG. 1 illustrates a schematic configuration of a power source system of vacuum equipment and an apparatus for suppressing abnormal electrical discharge used for the vacuum equipment. In FIG. 1, the power source system is provided with a high-frequency power source 10 incorporating a power controller 1, an oscillator 6, and a sensor 9. The power controller 1 uses a forward power "Pf" detected by the sensor 9 as a feedback signal, and controls an output power based on a difference with respect to a power command value "Cs". The high-frequency power source 10 supplies power to the plasma load 12 via a matching circuit 11. Here, the plasma load 12 is an electrical load when the plasma formed within a plasma reaction chamber provided in the vacuum equipment is viewed from the power source side.

In the power source system, the power controller 1 inputs from the sensor 9, the forward power Pf as the feedback signal, exercises a feedback control based on a deviation between the feedback signal being inputted and the power command value Cs, and controls the power outputted from the high-frequency power source 10 to become equal to the power command value Cs. The control by the power controller 1 is implemented by controlling the output power with respect to the power command value Cs, or by controlling the output voltage with respect to a voltage command value. In the following, an explanation will be made as to the case where the output power is controlled with respect to the power command value Cs.

The sensor 9 detects the forward power Pf which is transmitted from the high-frequency power source 10 to the plasma load 12, and a reflected power "Pr" being directed from the plasma load 12 to the high-frequency power source 10. A detection signal of the forward power Pf is made to feedback to the power controller 1, and a detection signal of the reflected power Pr is transmitted to the arcing detection/cutoff part 4 held by the cutoff controller 3 which will be described below, and the detection signal of the forward power Pf is transmitted to the cutoff control prohibition part 5.

The sensor 9 detects the forward power Pf and the reflected power Pr, and transmits a detection signal of the forward power Pf and a detection signal of the reflected power Pr to the power controller 1. The power controller 1 allows the power outputted from the high-frequency power source 10 to follow a target value, according to the feedback control using the detection signal of the forward power Pf.

The feedback control by the power controller 1 generates a difference signal between the power command value Cs and the forward power Pf, as a command signal to control the output power, and inputs the command signal into one of terminals of an operating amplifier 7. On the other hand, a high-frequency signal serving as a reference is inputted in the other terminal of the operating amplifier 7. The operating amplifier 7 controls the amplitude of the high-frequency signal based on the command signal from the power controller 1. An oscillator 6 is capable of generating the high-frequency signal, and a frequency of the high-frequency signal can be determined in accordance with the high-frequency which is supplied to the plasma load. For example, it may be assumed as a frequency signal of 13.56 MHz.

Accordingly, an AC output signal from the operating amplifier 7 is controlled in such a manner that the power which is supplied to the plasma load 12 is made to be equal to the power command value Cs. The output signal from the operating amplifier 7 is changed to be a predetermined power by a power amplifier 8, and thereafter, it is transmitted to the plasma load 12 via the matching circuit 11.

The operating amplifier 7 is allowed to exercise the feedback control, but instead of the operating amplifier 7, an inverter may be employed for the feedback control. Therefore, a PWM control signal, which controls a switching interval of a switching element, may be applicable to control the voltage of the AC power.

In addition, the power controller 1 detects an increase of the reflected power "Pr" by using the detection signal of the reflected power Pr, and exercises drooping control when the increase of the reflected power Pr is detected. Accordingly, the power controller suppresses the overcurrent or overvoltage along with the increase of the reflected power Pr, and protects the power supply.

The matching circuit 11 is a circuit to perform an impedance matching between the high-frequency power source 10 side and the plasma load 12. For example, an inductance and a condenser may constitute this matching circuit.

Figure 2:
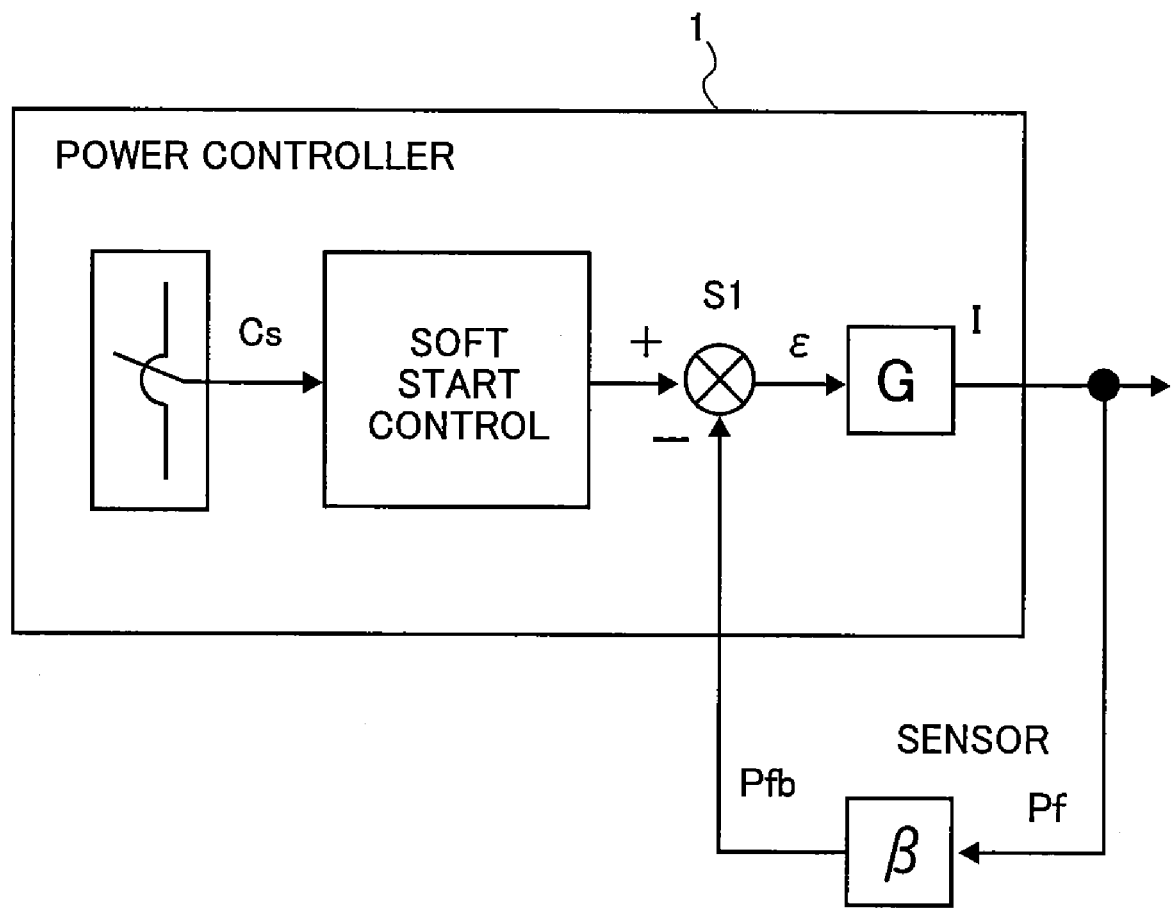
FIG. 2 is a block diagram showing a control system of a power source controller according to the present invention.

FIG. 2 is a block diagram showing a control system of the power supply controller.

In FIG. 2, "Cs" indicates a power command value which is associated with a target value of the power outputted from the high-frequency power source 10, and "Pf" indicates a forward power which is directed to the plasma load 12. In this control system, the feedback control is exercised in such a manner that the forward power Pf being the output power is made to agree with the target value Cs being the power command value.

In the power controller 1, "S1" indicates a summing point, where a difference is calculated between the power command value Cs and a detection signal "Pfb" of the forward power that is a feedback from the sensor 9 via a transfer function $\beta$, and this difference is outputted as a power control deviation $\epsilon$. The sign "G" indicates a transfer function used for generating a current command signal "I" according to the power control deviation $\epsilon$, the transfer function having a proportional characteristic and an integral characteristic. The forward power Pf is supplied to the plasma load 12, and simultaneously subjected to feedback to the summing point "S" via the transfer function $\beta$. The sign "$\beta$" is a transfer function used for subjecting the forward power Pf to the feedback to the summing point S. In the example here, the sign "$\beta$" corresponds to the transfer function of the sensor 9 for detecting the forward power Pf.

The power controller 1 includes a soft start control which allows a ramp-like increase of power from zero-output state to a predetermined power value, at the time of startup or restarting after cutting off.

In the apparatus for suppressing abnormal electrical discharge used for vacuum equipment according to the present invention, the high-frequency power source 10 is provided with a mechanism which temporarily cuts off the power outputted towards the plasma load 12, upon detecting abnormal electrical discharge. This cutoff mechanism includes a cutoff controller 3 which controls a cutoff operation of the outputted power. The cutoff controller 3 further includes an arcing detection/cutoff part 4 which detects arcing and controls the cutoff operation, a cutoff control prohibition part 5 for prohibiting the operation of the arcing detection/cutoff part 4, in the case other than the abnormal electrical discharge, and continues supplying of power, and a cutoff interruption part 2 which performs the cutoff operation according to the cutoff controller 3 for the ordinal power control.

The cutoff interruption part 2 receives a cutoff control by the cutoff controller 3, and halts the operation of the oscillator 6. With the halt of operation of the oscillator 6, the power supply from the high-frequency power source 10 to the plasma load 12 is brought to a halt temporarily. The cutoff control may include an operation to reduce the power volume to be supplied, in addition to halting the power supply to the plasma load 12, and the outputted power can be suppressed by the power controller 1, instead of halting the operation of the oscillator 6.

The arching detection/cutoff part 4 of the cutoff controller 3 inputs a detection signal of the reflected power Pr that has been detected by the sensor 9, compares the detection signal of the reflected power Pr with a threshold for the cutoff. When a magnitude of the detection signal of the reflected power Pr exceeds the threshold, it is determined that abnormal electrical discharge has occurred in the plasma load 12, and a cutoff command is outputted to the cutoff interruption part 2. Upon receipt of the cutoff command from the cutoff controller 3, the cutoff interruption part 2 halts the oscillating operation of the oscillator 6, thereby halting the power supply temporarily from the high-frequency power source 10 to the plasma load 12, and suppressing the occurrence of abnormal electrical discharge.

Suppression of the abnormal electrical discharge according to the cutoff controller 3 can be carried out by two types of cutoff control, including a first handling cutoff control which allows restarting in the state where ions remains in the plasma, and a second handling cutoff control which allows restarting in the state where abnormal arc ions have disappeared. One of the two cutoff controls can be selected based on different time durations for cutting off the output from the high-frequency power source.

The first handling cutoff control exercises the cutoff control while restarting is enabled in the state where ions are kept to remain in the plasma, thereby suppressing a growth of arc. On the other hand, the second handling cutoff control makes the abnormal ions to disappear, thereby eliminating accumulation of ions which may generate an abnormal arc.

The arching detection/cutoff part 4 of the cutoff controller 3 exercises the first handling cutoff control and the second handling cutoff control, the cutting off time of the controls being different from each other. The first handling cutoff control allows the ions to remain within the plasma reaction chamber, and exercises the cutoff control over the high-frequency power source within the time duration that allows an arcing element to disappear. On the other hand, the second handling cutoff control exercises the cutoff control over the high-frequency power source within the time duration that allows the abnormal arc ions to disappear.

The first handling cutoff control sets the duration of the cutoff time to be short, for example, from 1 μs to 100 μs, and terminates the cutoff control in the state where the ions is kept to remain within the plasma reaction chamber. Accordingly, the arcing element being a factor of the abnormal electrical discharge is allowed to disappear according to this cutoff in a short time period, thereby eliminating the abnormal electrical discharge. In addition, during the cutoff duration by the first handling cutoff control, the ions are kept to remain within the plasma reaction chamber. Therefore, at the time of restarting after the cutoff, boot-up of the power supply can be carried out immediately within a short period of time, allowing instantaneous resumption of normal discharge.

The second handling cutoff control sets the duration time to be longer than that of the first handling cutoff control, which is in the range of 1 ms to 100 ms, allowing the cutoff control to terminate in the state where the abnormal arc ions have disappeared. Accordingly, it is possible to eliminate accumulation of ions which may cause the abnormal arc, thereby cutting off arching.

In the present invention, at the time when the reflected power reaches a low level threshold (a first handling level), the cutoff operation according to the first handling cutoff control stops supplying of power, and eliminates the abnormal electrical discharge. In addition, at the time when the reflected power reaches a high level threshold (a second handling level), the cutoff operation according to the second handling cutoff control stops supplying of power, and allows the abnormal arc ions to disappear. This second handling cutoff control is also referred to as "arc ion refresh operation".

The cutoff operation according to the first cutoff control is carried out prior to the cutoff operation according to the second cutoff control. Therefore, the first cutoff control is referred to as "first handling" and the second cutoff control is referred to as "second handling". In addition, the first handling level is set to be lower than the second handling level.

The power controller 1 cuts off the output from the high-frequency power source 10 according to the first handling cutoff control, and thereafter, restarting is executed by a high speed boot-up. Then, the power controller 1 subjects the forward power value Pf to the feedback control with respect to the power command value Cs, and controls the output from the high-frequency power source to be equal to the power command value Cs.

The high speed boot-up enables the restarting after the first cutoff control, and this is carried out by ramp-like power, changing from zero output state to the power command value, outputted within a duration with the same time ordering as the cutoff time of the first handling cutoff control. Therefore, the duration required for the high speed boot-up can be determined in accordance with the cutoff time of the first handling cutoff control. This time duration may be in the range from 1 μs to 100 μs, for instance.

Furthermore, the power controller 1 exercises the second handling cutoff control to cut off the output from the high-frequency power source 10, and thereafter executes a soft-start restarting. Then, the power controller subjects the forward power value Pf to the feedback control with respect to the power command value Cs, and controls the output from the high-frequency power source to be equal to the power command value Cs.

The soft start for restarting after the second handling cutoff control is executed at a matching speed, which allows the matching circuit 11 to sufficiently handle the ramp-like power output changing from the zero output state to the power command value Cs. Accordingly, it is possible to suppress the increase of the reflected power Pr caused by a matching fault.

Therefore, the time duration required for the soft start of restarting after the second handling cutoff control can be determined depending on the magnitude of the power command value Cs, a matching characteristic of the matching circuit 11, and the like. The time duration of the soft start may be set to 1 ms to 10 s, for instance.

The second handling cutoff control aims at eliminating accumulation of ions which may cause an abnormal arc, thereby cutting off arcing. Therefore, it is effective to exercise the control, at the stage where the ions that may cause the abnormal arc have already been accumulated.

According to the cumulative number of executions of the first handling cutoff control which is executed within a predetermined period of time, the second handling cutoff control determines a state of the accumulated ions which may cause the abnormal arc. The second handling cutoff control is executed by determining a point of time when the cumulative number of executions of the first handling cutoff control reaches a preset number of times, as a stage where the ions which may cause the abnormal arc in the plasma have been accumulated. Therefore, the arcing detection/cutoff part 4 and the cutoff control prohibition part 5, provided in the cutoff controller 3, count the number of executions of the first handling cutoff control, and execute the second handling cutoff control at the time when a value of count obtained by the counting reaches a preset number of times.

Simultaneously with executing the second handling cutoff control, the value of count is cleared, and counting is restarted to count the number of executions of the first handling cutoff control. At the time when the value of count reaches the preset number of times within a predetermined period of time, the second handling cutoff control is executed again. The first cutoff control executed for the preset number of times and the second cutoff control subsequently, are repeated, thereby effectively suppressing the growth of arc and eliminating the abnormal arc ions.

The cutoff controller 3 is allowed to exercise the cutoff control in two modes; the first handling cutoff control and the second handling cutoff control.

For example, abnormal electrical discharge is detected by comparing an absolute value level of the reflected power with a threshold, and each control can be carried out according to the abnormal electrical discharge being detected.

In the case where abnormal electrical discharge is detected by comparing the absolute value level of the reflected power with the threshold, the first handling cutoff control detects the abnormal electrical discharge when the reflected power is compared with a low level threshold, and according to the detection of the abnormal electrical discharge, the power supply is cut off. On the other hand, the second handling cutoff control detects the increase of the reflected power when the reflected power is compared with a high level threshold, and according to the detection of the increase of the reflected power, the power supply is cut off.

Selection of the first handling cutoff control or the second handling cutoff control is determined by varying the magnitude of the threshold, which is used for the comparison with the reflected power Pr. The first handling cutoff control uses a lower level value as the threshold for the comparison with the reflected power Pr, and detects an initial stage of increase of the reflected power. Accordingly, it is possible to detect the increase of the reflected power along with the occurrence of abnormal electrical discharge. Consequently, the abnormal electrical discharge occurring during plasma film formation and etching can be cut off under the minority arc condition.

On the other hand, the second handling cutoff control uses a higher level value than the low level value used in the first handling cutoff control, and detects the increase of the reflected power at a stage subsequent to the initial stage.

Accordingly, a state of majority wave arc is detected, where energy is concentrated and a transition is made to a majority abnormal discharge, and then, the cutoff is executed.

The cutoff control prohibition part 5 prohibits the cutoff control of the power supply by the arcing detection/cutoff part 4, in the section defined as the arc cutoff prohibited section. Therefore, even in the case where a control for cutting off the power supply is supposed to be executed, the cutoff control prohibition part 5 prohibits the cutoff control and continues the power supply. The arc cutoff prohibited section is defined so as to prevent the power supply from being brought to halt due to a false detection as abnormal electrical discharge, when an increase of the reflected power is caused by a reason other than the abnormal electrical discharge. If the arcing detection/cutoff part 4 detects the increase of the reflected power and outputs a cutoff command in this arc cutoff prohibited section, this cutoff command is prohibited and the cutoff control is not executed.

Here, followings may be assumed as the arc cutoff prohibited section; an ignition mode section at the time of startup of the high-frequency power source, a high speed boot-up section after the first handling cutoff control, an ignition mode section after the second handling cutoff control, a forward power transient section where the feedback value (forward power) is allowed to gradually approach the power command value until entering a predetermined fluctuation range.

The ignition mode section and the re-ignition mode section are sections in which it is possible to assume that the plasma has been ignited, each corresponding to the section from a time point when the forward power starts outputting power until when the forward power exceeds the droop level of the reflected power. If the reflected power has increased within this section, the high-frequency power source exercises a reflected power drooping control as a protective operation, and therefore it is not necessary to exercise the first handling cutoff control. It is to be noted that the second handling cutoff control executes the cut off operation for protection, regardless of whether or not it is in the arc cutoff prohibited section.

If the increase of the reflected power is detected by the first handling cutoff control, and it is erroneously detected as a detection of abnormal electrical discharge, supplying of power is cut off based on the false detection, disabling the power supply to the plasma, even though there is no occurrence of abnormal electrical discharge actually. Therefore, in the present invention, the power supply is continued without cut off in the arc cutoff prohibited section.

In the ignition mode section or in the re-ignition mode section, the arc cutoff prohibited section can be defined according to the droop level. The droop level can be defined by "L×Cs 100%": a command value of rated power "Cs 100%" is multiplied by the reflected droop coefficient "L". Here, the reflected droop coefficient L may be defined to be in the range of 0.1 to 0.3.

At the time of starting or restarting, the forward power is increased, being delayed from the increase of the power command value Cs, and the forward power approaches gradually the power command value Cs according to the feedback control. In the section where the forward power is in a transient state, if a detection of the increase of the reflected power is determined as the abnormal electrical discharge and supplying of power is cut off based on the detection, supplying of power to the plasma is disabled even though there is no occurrence of abnormal electrical discharge. Therefore, this forward power transient period is assumed as an arc cutoff prohibited section, and the power supply is continued without being cut off.

This forward power transient section can be defined as a section where a power feedback value (forward power) goes out of a predetermined fluctuation range with respect to the power command value, and it is an section where there is a sufficiently large difference (Cs−Pf) between the forward power "Pf" and the power command value "Cs". This section can be defined as a level range assuming the power command value "Cs" as an upper limit, and a value (Cs−K×Cs 100%) as a lower limit, obtained by subtracting "K×Cs 100%" from the power command value "Cs"; where "Cs" represents the power command value, "Cs 100%" represents a command value of rated power, and "K" represents a predetermined coefficient. When the forward power Pf is out of the level range, it is assumed as the arc cutoff prohibited section, and the power supply is continued without cut off. Here, the coefficient "K" may be set to be a value within a range of from 0.01 to 0.2, for instance.

By way of example, when the coefficient "K" is set to 0.03, the arc cutoff prohibited section can be defined by the power range having the power command value Cs as an upper limit, and (Cs−0.03×Cs 100%) as a lower limit. When the forward power goes out of the range, the cutoff control is prohibited, and the power supply is continued without a halt.

Next, with reference to the signal diagrams shown in FIG. 3 and FIG. 4, and the flowcharts shown in FIG. 5 and FIG. 6, the cutoff process and the cutoff prohibition process will be explained. It is to be noted that there will be explained a first cutoff process which is carried out upon detecting an abnormal electrical discharge, and an operation for prohibiting the first handling cutoff process in the arc cutoff prohibited sections; the ignition mode section, the re-ignition mode section, and the forward power transient section. It is to be noted that FIG. 4 and FIG. 6 illustrates the cutoff process for performing the second handling cutoff, when the first handling cutoff occurs more than once.

FIG. 3 is a signal diagram showing that power boot-up of the high-frequency power source 10 is performed by the soft start control, and high speed boot-up of power is performed, after the first handling cutoff. FIG. 4 illustrates the high speed power boot-up after the first handling cutoff, and also illustrates the soft start after the second handling cutoff.

Broken lines shown in FIG. 3 and FIG. 4 represent a power command value "Cs", the thick solid line represents the forward power "Pf", and the thin solid line represents the reflected power "Pr". In each of FIG. 3 and FIG. 4, the thin broken lines represent the power level defining the arc cutoff prohibited section, and these lines include a droop level of the reflected power, and a level range that fluctuates according to the power command value Cs. The ignition mode section and the re-ignition mode section, which are defined by the droop level, and the section where the reflected power is lower than the level range are assumed as the arc cutoff prohibited section, indicating that the arc cutoff operation is prohibited in this section.

Initially, according to the soft start control, the power is made to increase gradually with a ramp-like increase property, taking a predetermined time length, from zero power to a target power.

The ignition mode section is defined within the soft start. The ignition mode section corresponds to an initial period from the start of applying power to the plasma load, and in this example here, this section is assumed as starting from the point where the forward power starts increasing, then matching is performed, until the state reaching the ignition point. The state where the forward power is equal to or less than the droop level is defined as the ignition mode section.

Subsequent to the ignition mode section, a section where the forward power is below the level range is set as the arc cutoff prohibited section. This forward power transient section corresponds to a transitional period, in which, in association with a difference between the forward power Pf and the power command value Cs, generated by a delay of the forward power, the forward power Pf is increased and approaches gradually the power command value Cs. In this section, the difference (Cs−Pf) is sufficiently large between the forward power Pf and the power command value Cs. This forward power transient section can be defined by the level range, having the power command value "Cs" as an upper limit, and the value (Cs−K×Cs 100%) as a lower limit; subtracting K×Cs 100%, which is obtained by multiplying the command value of rated power "Cs 100%" by a predetermined coefficient "K", from the power command value "Cs".

In the ignition mode section and in the forward power transient section, there is a possibility that the reflected power Pr is increased due to a malfunction in matching with the plasma load. Therefore, if an abnormal electrical discharge is detected using the increase of the reflected power Pr as an index, the increase of the reflected power Pr during this section may be erroneously detected as the abnormal electrical discharge. Accordingly, in the present invention, supplying of power is continued without being cut off, even when it is detected that the reflected power Pr has increased in the ignition mode section and in the forward power transient section.

Therefore, in the case of the ignition mode section where the reflected power is equal to or less than the droop level, and in the case where the traveling wave power Pf exists out of the level range of the traveling wave power transient section, which is set based on the power command value, these sections are assumed as the arc cutoff prohibited section, and supplying of power is continued without being cut off.

Therefore, the range of the arc cutoff prohibited section is a range where the forward power Pf fluctuates significantly with respect to the power command value Cs. In this section, cutting off the power supply, which is triggered by the increase of the reflected power Pr is suppressed, the increase not caused by the abnormal electrical discharge, and supplying of power is continued. The increase of the reflected power Pr not caused by the abnormal electrical discharge is reduced by the drooping characteristic for protecting the power source.

The matching section in the figure corresponds to a section from starting the power application until the time when a follow-up control of the forward power Pf toward the power command value Cs becomes stable. Subsequent to this section, the feedback control controls the forward power Pf, so that it follows the power command value Cs.

After the end of the soft start section, a constant value is designated as the power command value Cs, so that the power is supplied stably to the plasma load, and the forward power Pf follows the power command value Cs by the feedback control. Then, the forward power is stabilized at the command value of rated power Cs 100%.

In this state, when the reflected power Pr is increased and goes over the first handling cutoff level, arching is generated and it is determined that an abnormal electrical discharge has occurred. Then, an interruption from the cutoff interruption circuit 2 stops oscillation of the oscillator 6 to stop supplying power, and the power supply from the high-frequency power source 10 to the plasma load 12 is temporarily cut off. The cutoff to stop the oscillation of the oscillator 6 by the cutoff interruption circuit 2 is performed at a time interval of 1 μsec to 3 μsec, for instance. The range of the cutoff time for the temporary cutoff is set to be the shortest time range within which ions in the plasma chamber are allowed to remain, and the arcing element is allowed to disappear. By way of example, the shortest time range may be 1 μsec to 100 μsec. Since the ions are allowed to remain, it is possible to achieve a normal discharge immediately, during the reboot-up after the temporary cutoff. In the figure, this temporary cutoff section is described as the first handling ($1^{st}$ handling) cutoff.

Even in the course of the temporary cutoff, the plasma control state is retained. Therefore, the control operation can be resumed promptly without this retained state being released at the time of restarting control after the temporary cutoff, and performing an initial process for the plasma control.

After a lapse of the temporary cutoff section of the first handling cutoff, the cutoff process is terminated, and a boot-up control is performed so that the forward power Pf becomes equal to the power command value Cs. Here, this boot-up control is referred to as "high speed boot-up control". During this high speed boot-up control, the forward power Pf increases significantly from an almost zero status, and along therewith, the reflected power Pr is also increased from an almost zero status.

The cutoff controller 3 detects the increase of the reflected power Pr, and it is supposed to perform a control to cut off the power supply by interruption according to the cutoff interruption circuit 2. However, when the cutoff control by this cutoff controller 3 is executed, the power supply is cut off, disabling the high speed boot-up control. Therefore, this section is assumed as the arc cutoff prohibited section, prohibiting the cutoff control by the cutoff controller 3 to avoid stopping of the power supply. The arc cutoff prohibited section can be configured as described above, by determining that the forward power Pf is within the range less than or equal to the droop level of the reflected power, and whether or not the forward power Pf is within the range having the power command value "Cs" as an upper limit and a value (Cs−K·Cs 100%) as a lower limit, which is a result of subtracting a value obtained by multiplying the command value of rated power "Cs 100%" by a predetermined coefficient "K", from the power command value "Cs".

The ignition mode section, the re-ignition mode section, and the forward power transient section are assumed as the arc cutoff prohibited section, and in this arc cutoff prohibited section, the cutoff control prohibition part 5 prohibits the cutoff control by the arcing detection/cutoff part 4, and continues the power supplying. FIG. 3B and FIG. 4B illustrate the arc cutoff prohibited section; FIG. 3C and FIG. 4C illustrate the detection state according to the first handling cutoff control; FIG. 3D and FIG. 4D illustrate the cutoff state according to the first handling cutoff control; and FIG. 3E and FIG. 4E illustrate the detection and the cutoff state according to the second handling cutoff control.

Figure 5:
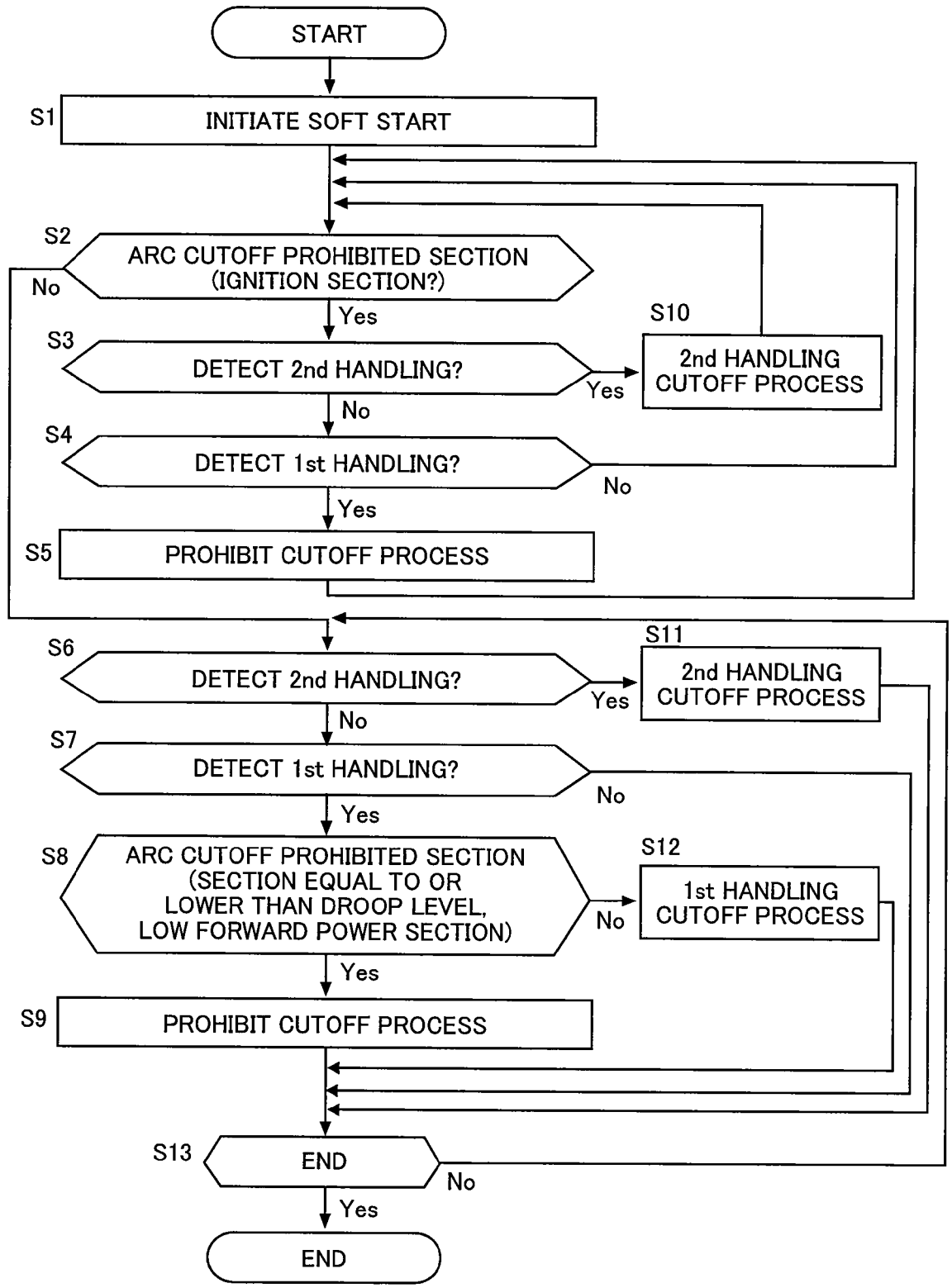
FIG. 5 is a flowchart for explaining the cutoff process and the cutoff prohibition process according to the present invention.
Figure 6:
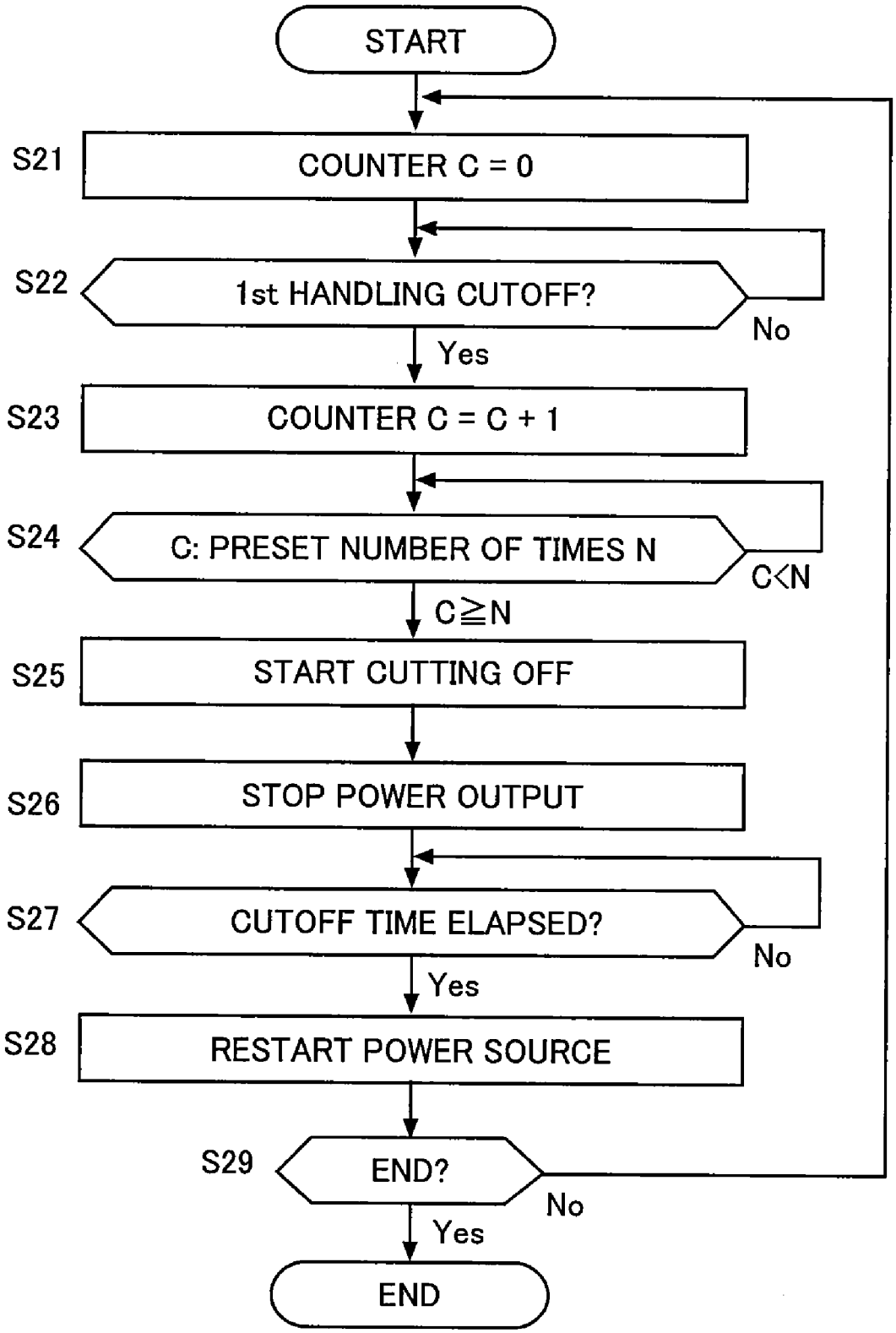
FIG. 6 is a flowchart for explaining the cutoff process and the cutoff prohibition process according to the present invention.

In the flowchart shown in FIG. 5, the power controller 1 initially starts the soft start control (S1). After starting the soft start, when the traveling wave is in the ignition mode section (S2), the arcing detection/cutoff part 4 compares the reflected power Pr with the second handling cutoff level, and if an arc is detected by the second handling (S3), the second handling cutoff process is performed (S10). On the other hand, if an arc is not detected by the second handling within the ignition mode section, but an arc is detected by the first handling (S4), the power supply is continued, not performing the cutoff process, because this section is the arc cutoff prohibited section (S5).

After the forward power exceeds the droop level of the reflected power, and goes out of the ignition mode section (S2), the arcing detection/cutoff part 4 compares the reflected power Pr with the second handling cutoff level. If an arc is detected by the second handling (S6), the second handling cutoff process is performed (S11). On the other hand, if an arc is not detected by the second handling, but an arc is detected by the first handling (S7), the power supply control is continued without performing the cutoff process in the forward power transient section (S8), since this section is assumed as the arc cutoff prohibited section (S9).

On the other hand, if it is not the arc cutoff prohibited section (S8), the first handling cutoff process is performed (S12).

The steps from S1 to S12 described above are applied to the ignition mode section and the forward power transient section as shown in FIG. 3B, which correspond to the arc cutoff prohibited section.

The steps from S6 to S12 are applied to the high speed boot-up after the first handling cutoff or at the time of soft start after the second handling cutoff, in the arc cutoff prohibited section in FIG. 3B and in FIG. 4B (S13).

FIG. 3C and FIG. 4C illustrate arcing detection signals according to the first handling, detected by comparing the reflected power with the first handling level. FIG. 3D and FIG. 4D illustrate cutoff signals according to the first handling after the cutoff control prohibition process is executed.

Among the detection signals as shown in FIG. 3C and in FIG. 4C, arcing detection signals within the arc cutoff prohibited section of FIG. 3B and FIG. 4B are prohibited from being subjected to the cutoff process, and only the cutoff signals not in the cutoff control prohibited section are extracted, which are the cutoff signals shown in FIG. 3D and FIG. 4D, and accordingly the first handling cutoff control is executed based on these cutoff signals.

FIG. 3E and FIG. 4E each illustrates a cutoff signal which is obtained by comparing the reflected power with the second handling cutoff level. The cutoff signal obtained by the second handling cutoff level performs the cutoff control without conditions, regardless of whether or not it is in the cutoff control prohibited section.

If the detection is carried out both in the first handling and in the second handling simultaneously, a high priority is put on the second handling. For example, the second handling cutoff as shown in each of FIG. 3E and in FIG. 4E is performed in priority to the first handling cutoff at the same point of time as shown in FIG. 3D and in FIG. 4D.

Next, with reference to the signal diagram as shown in FIG. 4 and the flowchart shown in FIG. 6, an explanation will be made as to the cutoff process and the cutoff prohibition process which are executed when multiple times of first handling cutoff are executed.

In the cutoff process, the first handling cutoff in a short duration within a predetermined time (e.g., 10 msec) is executed for a preset number of times, and thereafter, a temporary cutoff is executed according to the second handling cutoff in a relatively long duration (e.g., 1 msec to 100 msec).

In the signal diagram as shown in FIG. 4, after performing the first handling cutoff more than once, the temporary cutoff is executed by the second handling cutoff for the time duration (e.g., 1 msec to 100 msec) which is longer than the cutoff time duration according to the first handling cutoff. After the second handling cutoff, the high frequency power source 10 is controlled by the soft start to boot up the power. In this soft start control, similar to the soft start control at the ignition time as described above, the power is made to increase gradually according to a ramp-like increase property from zero to a target power, taking a predetermined time. The broken line in FIG. 4 represents a power command value "Cs", a thick solid line represents a forward power "Pf", and a thin solid line represents a reflected power "Pr".

It is to be noted here that the process for prohibiting the cutoff and the process for rebooting up after the cut off are the same as those processes described above.

FIG. 6 is a flowchart to explain a procedure for executing the temporary cutoff according to the second handling cutoff.

In a counter circuit, a counter value "C" is assumed as zero (C=0) and every time when the first handling cutoff is executed (S22), "1" is added to the counter value "C" (C=C+1). The increment of the counter value "C" is performed according to a control signal from the first handling cutoff (S23).

The counter value "C" is compared with a preset number of times "N" (S24), and when the counter value C becomes equal to or larger than the preset number of times N, the temporary cutoff is started (S25), and the power source is brought to halt (S26). It is to be noted that if the counter value C does not reach the preset number of times N, the second handling cutoff is not performed, and only the first handling cutoff is repeated.

After a lapse of predetermined time (S27), the second handling cutoff reboots up the power source by the soft start (S18). The steps from S21 to S28 are repeated until the film formation process by plasma is completed (S29).

FIG. 4B illustrates the re-ignition mode section and the forward power transient section, which are the arc cutoff prohibited section; FIG. 4C illustrates arcing detection signals, which are detected by comparing the reflected power with the first handling level; and FIG. 4D illustrates cutoff signals of the first handling. The arcing detection signals within the arc cutoff prohibited section are prohibited from being cut off, and only the cutoff signals not in the cutoff control prohibited section are extracted, which are the cutoff signals as shown in FIG. 4D, and accordingly, the first handling cutoff control is exercised.

FIG. 4E illustrates a cutoff signal obtained by comparing the reflected power with the second handling cutoff level. The cutoff signal obtained at the second handling cutoff level is subjected to the cutoff control without conditions, regardless of whether or not it is in the cutoff control prohibited section.

Figure 7:
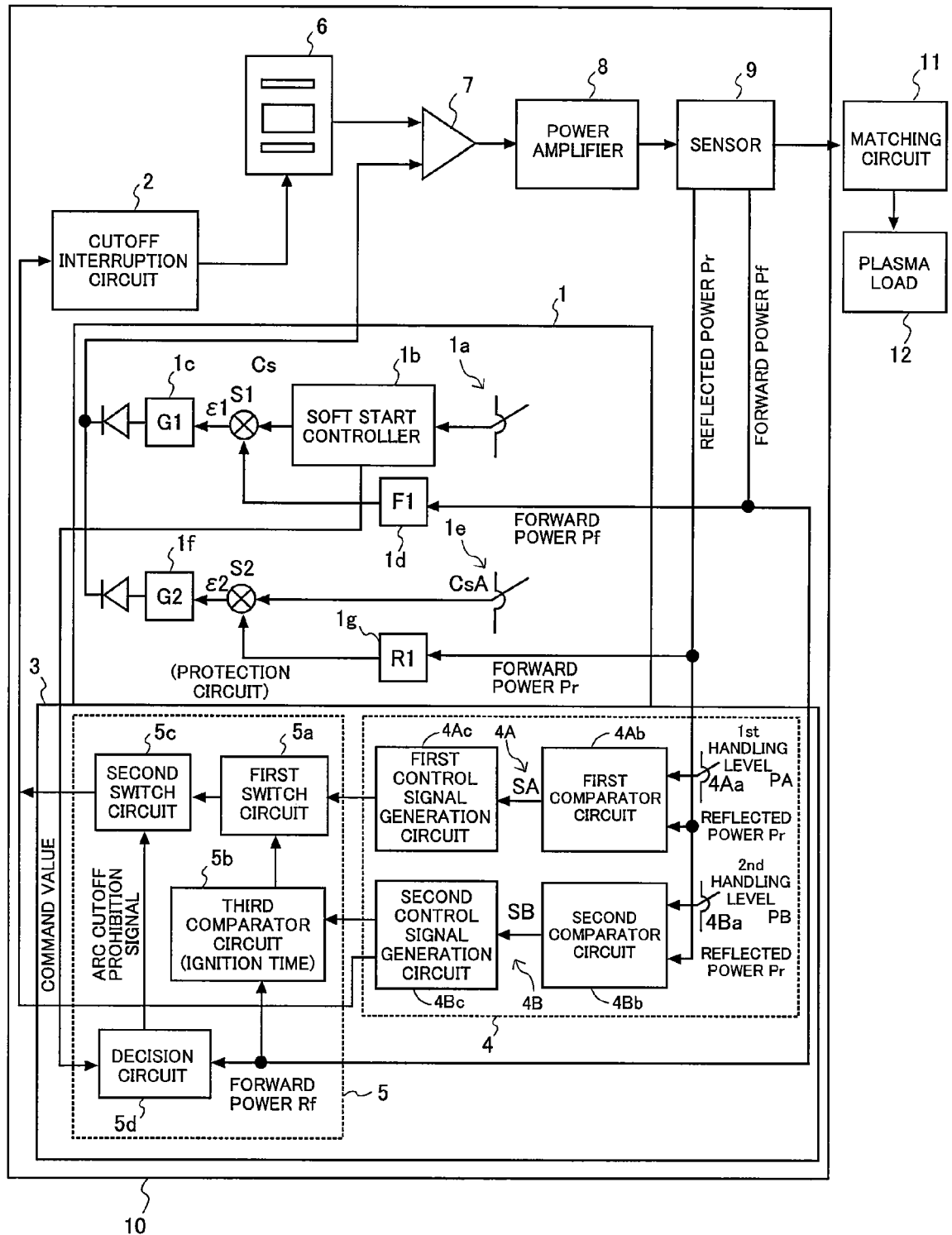
FIG. 7 illustrates a configuration example of an embodiment of the apparatus for suppressing abnormal electrical discharge used for vacuum equipment according to the present invention.
Figure 8:
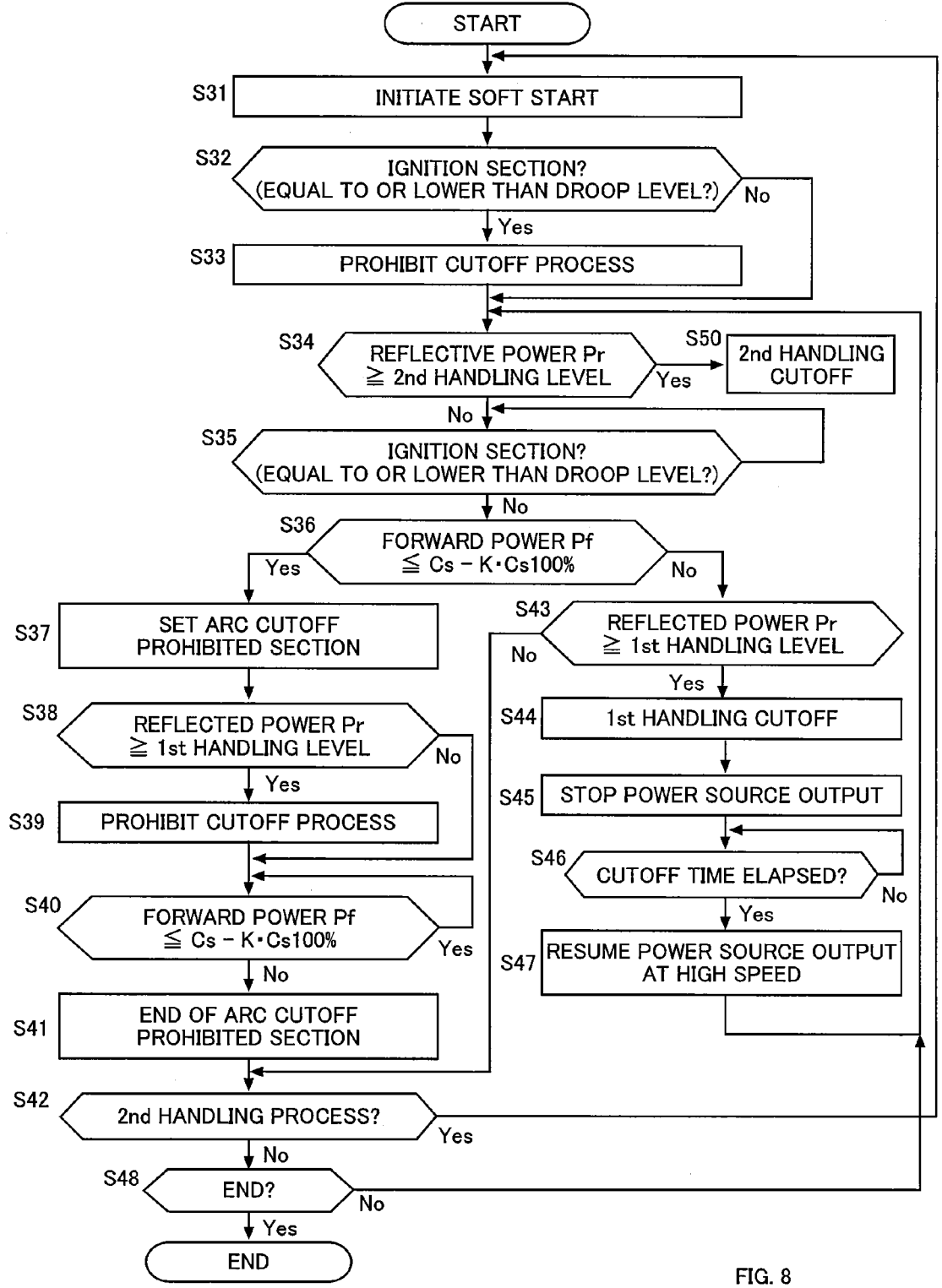
FIG. 8 is a flowchart for explaining the cutoff process and the cutoff prohibition process in an embodiment of the apparatus for suppressing abnormal electrical discharge used for vacuum equipment according to the present invention.
Figure 9:
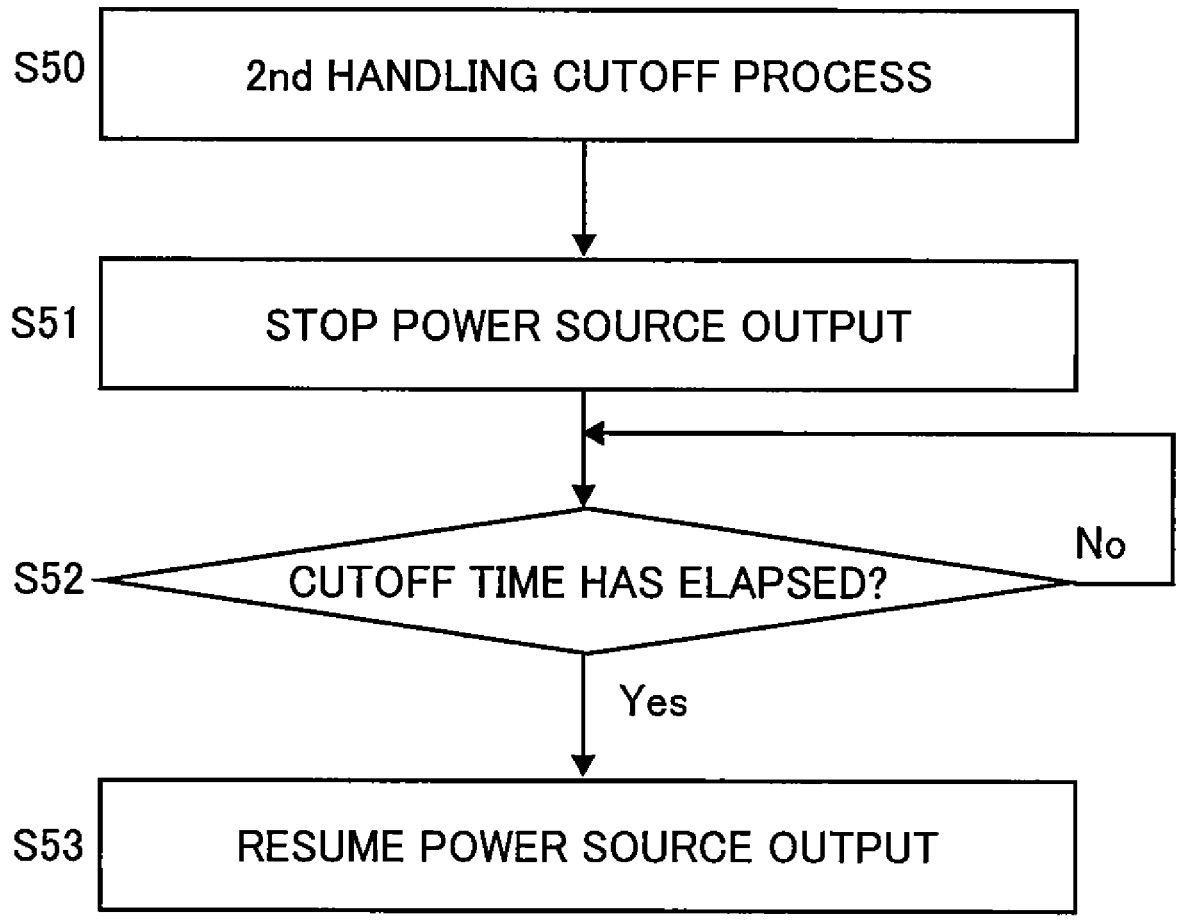
FIG. 9 is a flowchart for explaining the second handling cutoff in the apparatus for suppressing abnormal electrical discharge used for vacuum equipment according to the present invention.
Figure 10A:
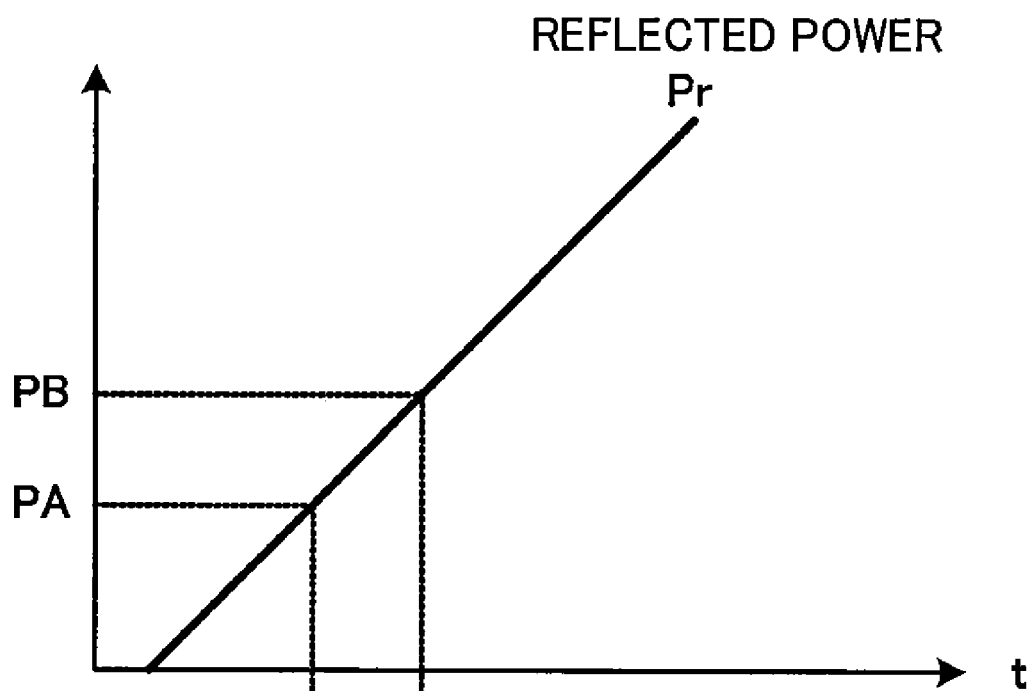
FIG. 10 is a diagram showing an output state of the cutoff controller which uses a comparator circuit.

Hereinafter, with reference to FIG. 7 to FIG. 10, an embodiment of the apparatus for suppressing abnormal electrical discharge used for vacuum equipment according to the present invention will be explained. FIG. 7 illustrates a configuration example of the embodiment of the present invention. FIG. 8 and FIG. 9 are flowcharts for explaining operation examples, and FIG. 10 illustrates an output state from the cutoff controller using a comparator circuit.

In the embodiment, it is determined whether or not the cutoff is possible, according to a power level of a reflected power, and the ignition mode section, the re-ignition mode section, and the forward power transient section are each assumed as an arc suppressive section.

FIG. 7 illustrates a configuration example of the cutoff controller 3 incorporating the power controller 1, the arcing detection/cutoff part 4, and the cutoff control prohibition part 5.

An explanation will be made regarding the arcing detection/cutoff part 4. The arcing detection/cutoff part 4 is provided with two cutoff control systems; a first handling cutoff control system 4A and a second handling cutoff control system 4B.

In this embodiment, the reflected power "Pr" is compared with the first handling cutoff level, and with the second handling cutoff level, thereby detecting a cutoff operation, making a sharp distinction between the cutoff operation caused by the abnormal electrical discharge and the cutoff operation caused by a factor other than the abnormal electrical discharge, and a control signal for performing any of the cutoff operations is outputted. The control signal suspends the oscillating operation by the oscillator 6 via the cutoff interruption circuit 2.

The first handling cutoff control system 4A compares the reflected power with a threshold at a low level (first handling level), thereby detecting an abnormal electrical discharge, and based on the detection of the abnormal electrical discharge, power supplying is cut off. On the other hand, the second handling cutoff control system 4B compares the reflected power with a threshold at a high level (second handling level), thereby detecting an increase of the reflected power, and based on the detection of the increase of the reflected power due to a factor other than the abnormal electrical discharge, power supplying is cut off.

Selection of the first handling cutoff control system 4A and the second handling cutoff control system 4B is made by varying magnitude of the threshold, which is compared with the reflected power Pr. The first handling cutoff control system 4A uses a first handling level value as the threshold being at a low level, and detects an initial stage of increase of the reflected power. Accordingly, a minority arc state is detected and cut off.

On the other hand, the second handling cutoff control system 4B uses as a threshold being at a high level, a value larger than the low level value used in the first handling cutoff control, and detects the increase of the reflected power at the stage subsequent to the initial stage. Accordingly, a state of majority wave arc is detected where energy is concentrated and a transition is made to a majority abnormal discharge, and then cutting off is performed.

The first handling cutoff control system 4A compares the reflected power Pr at the first handling cutoff level "PA", thereby detecting the abnormal electrical discharge and outputting a control signal. In receipt of the control signal, the cutoff interruption circuit 2 suspends supplying of the oscillation of the oscillator 6. Accordingly, supplying of power outputted from the high-frequency power source 10 to the plasma load 12 is temporarily cut off.

In the first comparator circuit 4Ab, the first handling cutoff control system 4A compares a detection signal of the reflected power Pr detected by the sensor 9, with the first handling cutoff level generated in the power setting part 4Aa. Then, at the time when the detection signal of the reflected power Pr exceeds the first handling cutoff level, a control signal is outputted. In receipt of this control signal, the cutoff interruption circuit 2 suspends the oscillation of the oscillator 6, and performs the cutoff operation.

On the other hand, the second handling cutoff control system 4B compares the reflected power Pr with the second handling cutoff level, thereby detecting the increase of the reflected power Pr due to a factor other than the abnormal electrical discharge, and forms a control signal which is transmitted to the cutoff interruption circuit 2. In receipt of the control signal, the cutoff interruption circuit 2 suspends the oscillation of the oscillator 6, and performs the cutoff operation, then supplying of the power outputted from the high-frequency power source 10 to the plasma load 12 is temporarily cut off.

In the second comparator circuit 4Bb, the second handling cutoff control system 4B compares a detection signal of the reflected power Pr detected in the sensor 9 with the second handling cutoff level generated in the power setting part 4Ba, and at the time when the detection signal of the reflected power Pr exceeds the second handling cutoff level, a control signal is outputted. In receipt of the control signal, the cutoff interruption circuit 2 performs the interrupting operation.

The first handling cutoff level is a low level threshold, and the second handling cutoff level is a high level threshold. Therefore, when the reflected power Pr is increased, the reflected power Pr initially exceeds the first handling cutoff level, and subsequently exceeds the second handling cutoff level.

It is to be noted that the control signal obtained in the first handling cutoff control system 4A is transmitted to the cutoff interruption circuit 2 via the cutoff control prohibition part 5. On this occasion, if the cutoff control prohibition part 5 is activated, the control signal is not transmitted to the cutoff interruption circuit 2. Therefore, the oscillating operation of the oscillator 6 is continued, and the operation for cutting off the output power supply is not carried out, thereby keeping the power supply to the plasma load.

On the other hand, the control signal obtained in the second handling control system 4B is transmitted to the cutoff interruption circuit 2 without passing through the cutoff control prohibition part 5. Therefore, without depending on the operation of the cutoff control prohibition part 5, the cutoff interruption circuit 2 suspends the oscillating operation of the oscillator 6 based on the control signal of the arcing detection/cutoff part 4, and cuts off supplying of the output power.

Figure 10B:
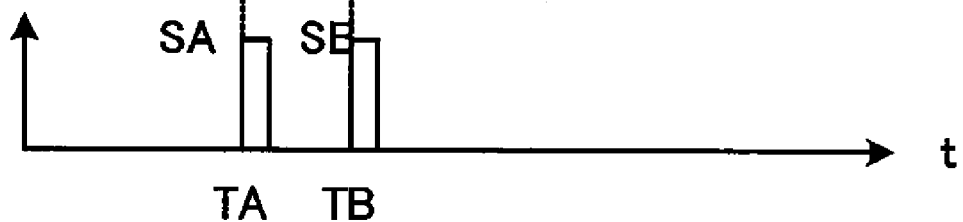

FIG. 10 illustrates an output state of the cutoff controller 3 which uses the comparator circuit. The reflected power Pr is increased, a control signal SA (FIG. 10B) is outputted at the point of time TA when the reflected power Pr exceeds the first handling cutoff level PA, and a control signal SB (FIG. 10B) is outputted at the point of time TB when the reflected power Pr exceeds the second handling cutoff level PB.

The cutoff control prohibition part 5 prohibits transmission of the control signal from the arcing detection/cutoff part 4, in the case where predetermined conditions are satisfied, such as in the ignition state, in the re-ignition state, and in the state where the forward power has fluctuated beyond a predetermined range (Cs~(Cs−K·Cs100%)) with respect to the power command value Cs. If the predetermined conditions are not satisfied, the control signal from the arcing detection/cutoff part 4 is transmitted to the cutoff interruption circuit 2. This control signal operates as an arc interruption signal for stopping the power supply and cutting off the arc, and it is transferred from the cutoff interruption circuit 2 to the oscillator 6, to suspend the oscillator 6.

In FIG. 7, the cutoff control prohibition part 5 is provided with a first switch circuit 5a and a third comparator circuit 5b, as a configuration for prohibiting transmission of the control signal in the ignition state. It is further provided with a second switch circuit 5c and a decision circuit 5d as a configuration for prohibiting transmission of the control signal, when the forward power Pf has fluctuated beyond the predetermined range with respect to the power setting value.

The configuration of the first switch circuit 5a and the third comparator circuit 5b controls whether or not the control signal generated in the arcing generation/cutoff part 4 is transmitted to the cutoff interruption circuit 2. When the high-frequency power source 10 is in the state of ignition, transmission of the control signal to the cutoff interruption circuit 2 is stopped and prohibited, whereas when the high-frequency power source 10 is not in the ignition state, transmission of the control signal to the cutoff interruption circuit 2 is permitted, rendering the control signal effective.

The third comparator circuit 5b compares the forward power Pf with the droop level of the reflected power, thereby deciding the ignition mode section. The third comparator circuit 5b turns the first switch circuit 5a to the ON state, when the forward power Pf exceeds the droop level. The droop level can be defined by "L×Cs 100%"; the command value of rated power "Cs 100%" is multiplied by the reflected droop coefficient "L". The reflected droop coefficient "L" can be set within the range of 0.1 to 0.3.

If a time interval of the ignition mode section is known, a counter circuit may perform time keeping for the elapsed time of the ignition and monitor the ignition state. Upon receipt of a signal notifying that power supplying has started, from the soft start controller 1b, the counter circuit starts time keeping of the ignition time, and after a lapse of a preset ignition time, the counter circuit turns the first switch circuit 5a to the ON state.

The first switch circuit 5a inputs a detection signal of abnormal electrical discharge, which has been detected in the first handling cutoff control system 4A of the arcing detection/cutoff part 4. The first switch circuit 5a stops transmission of the inputted detection signal to the second switch circuit 5c, prohibiting the control signal within the ignition time section, whereas the first switch circuit 5a permits the transmission of the inputted detection signal to the second switch circuit 5c, when being out of the ignition time section, thereby rendering the control signal effective.

In the configuration of the second switch circuit 5c and the decision circuit 5d, when the forward power fluctuates beyond the predetermined range (Cs~(Cs−K·Cs100%)) with respect to the power command value Cs, it is determined whether or not the control signal generated in the arcing detection/cutoff part 4 is transmitted to the cutoff interruption circuit 2. When the forward power fluctuates beyond the predetermined range, transmission of the control signal to the cutoff interruption circuit 2 is stopped and the control signal is prohibited. On the other hand, when the forward power fluctuates within the predetermined range, the transmission of the control signal to the cutoff interruption circuit 2 is permitted, rendering the control signal effective. More specifically, the second switch circuit 5c controls the transmission of the output signal from the first switch circuit 5a to the cutoff interruption circuit 2.

The decision circuit 5d inputs the detection signal of the forward power Pf from the sensor 9, and compares the detection signal of the forward power Pf with a threshold, thereby determining whether the forward power Pf has fluctuated beyond the predetermined range, or the forward power Pf has fluctuated within the predetermined range.

Here, the fluctuation range for deciding the fluctuation state of the forward power Pf, is a level range having the power command value "Cs" as an upper limit, and a value "(Cs−K×Cs 100%)" as a lower limit, which is obtained by subtracting K×Cs 100%; multiplying the command value of rated power "Cs 100%" by a predetermined coefficient "K", from the power command value "Cs". The predetermined coefficient "K" may be defined in the range of 0.01 to 0.2.

When the detection signal of the forward power Pf has fluctuated beyond the predetermined range, the decision circuit 5d transmits the arc interruption prohibition signal to the second switch circuit 5c, and the cutoff interruption circuit 2 prohibits the cutoff operation which is performed by stopping the power supply. Consequently, similar to the ignition state, if the forward power Pf has fluctuated significantly, it is possible to prevent the cutoff operation which is caused by a false recognition as an abnormal electrical discharge, according to the drooping control carried out for the protection against an excessive reflected power Pr, overvoltage, and overcurrent. The second switch circuit 5c controls transmission of the control signal to the cutoff interruption circuit 2, the control signal being inputted from the first switch circuit 4a, based on the decision signal from the deciding circuit 5d.

It is to be noted that the configuration of the cutoff control prohibition part 5 as described above is just an example, and the configuration is not restricted to this example. The signal state in the present embodiment may also be illustrated in FIG. 3 and FIG. 4.

In the flowchart as shown in FIG. 8, initially the soft start controller 1b starts the soft start control (S31). After the soft starting, the forward power Pf is compared with the droop level (e.g., L×Cs 100%), and it is monitored whether or not the section is in the ignition mode (S32). In the ignition mode section, only the second handling cutoff process is performed, and the first handling cutoff process is prohibited (S33).

When the reflected wave power Pr reaches or exceeds the second handling cutoff level in the second comparator circuit 4Bb (S34), a second handling arc is detected and the second handling cutoff process is performed (S50). In the second handling cutoff process, oscillation of the oscillator 6 is stopped, and after stopping the power source outputting (S51), a lapse of a predetermined time is waited (S52), and then the oscillation of the oscillator 6 is restarted to resume the power source output (S53).

After going out of the ignition mode section (S35), the fluctuation state of the forward power Pf is determined by comparing the forward power Pf with (Cs−K×Cs 100%). If the forward power Pf is out of the range between "Cs" and "(Cs−K×Cs 100%)" (S36), the arc cutoff prohibited section is set and the cutoff process is prohibited (S37).

In the arc cutoff prohibited section, even when the reflected wave power Pf reaches or exceeds the first handling cutoff level in the first comparator circuit 4Ab (S38), the power supplying is continued since the cutoff processing is prohibited (S39).

Then, when the traveling wave power Pf is increased and the traveling wave power Pf enters the range from "Cs" to "(Cs−K×Cs 100%)" (S40), the arc cutoff prohibited section is released (S41). When the reflected wave power Pr reaches or exceeds the second handling level, the second handling cutoff process is performed (S42). In the step of S36, if the traveling wave power Pf is within the range from "Cs" to "(Cs−K×Cs 100%)", the arc cutoff prohibited section is not set. Therefore, if the reflected wave power Pf reaches or exceeds the first handling cutoff level in the first comparator circuit 4Ab (S43), the first handling cutoff control (S44) stops the power source output (S45). After a lapse of a predetermined time period (from 1 μsec to 100 μsec) from the stop of the power source output (S46), it is resumed at high speed (S47). The processes in the steps from S34 to S42 are continued until the end (S48).

Next, with reference to FIG. 11, another configuration of the cutoff control prohibition part 5 will be explained.

Figure 11:
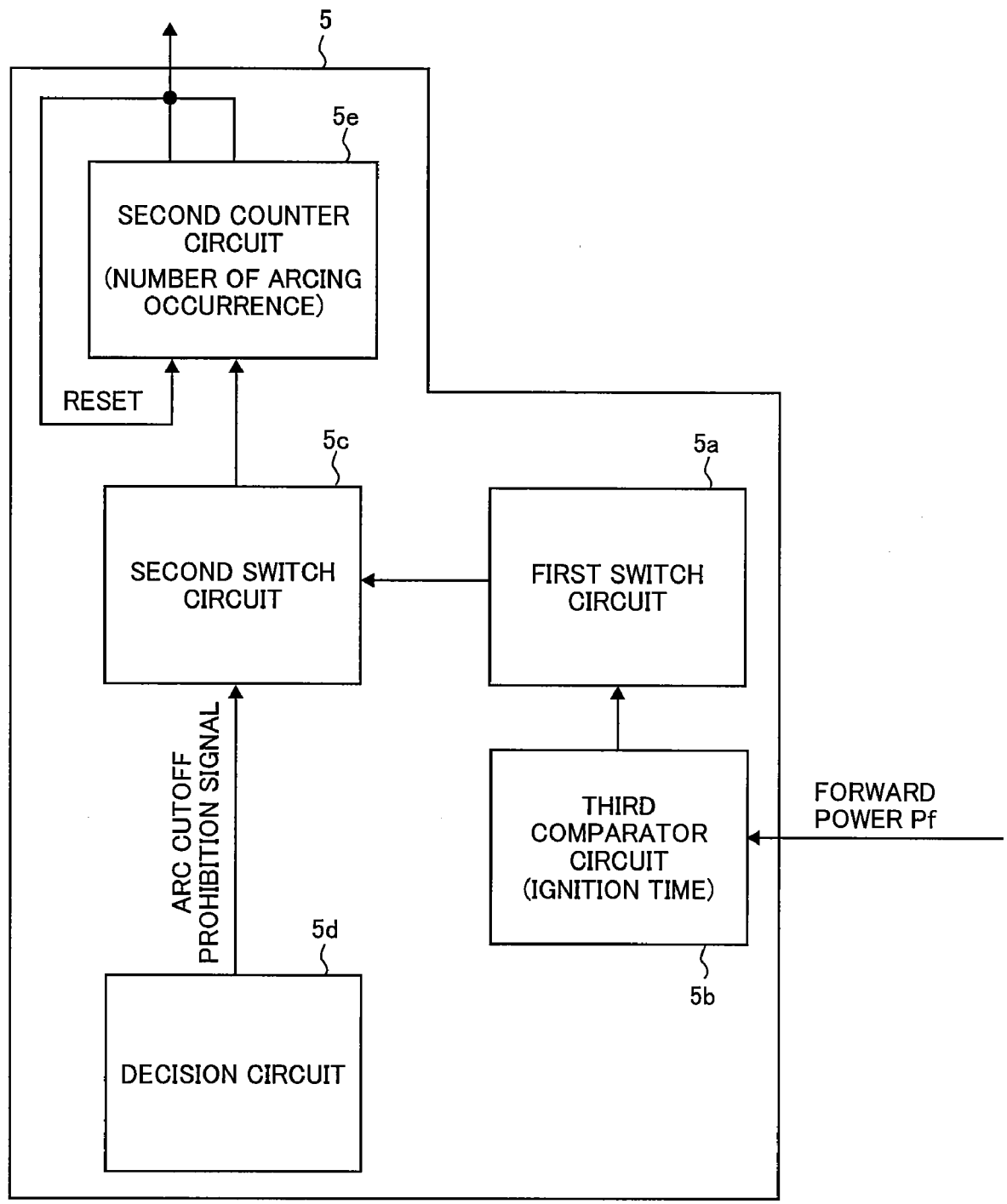
FIG. 11 illustrates another configuration example of the cutoff control prohibition part according to the present invention.

The configuration of the cutoff control prohibition part 5 as shown in FIG. 11 is an example which implements an ion refresh function to allow abnormal arc ions to disappear, those ions being accumulated in plasma.

The cutoff control (first handling cutoff) by the cutoff control prohibition part as described above enables the ions within the plasma reaction chamber to remain, and performs cutoff control over the high-frequency power source within a time duration in which the arcing element is allowed to disappear. On the other hand, the cutoff control of the configuration as shown in FIG. 11 extends the cutoff time, thereby allowing the abnormal arc ions to disappear.

In this cutoff control, for example, the time duration is set to be in the range of 1 ms to 100 ms, and the cutoff control is terminated in the state where the abnormal arc ions have disappeared. Accordingly, accumulation of ions which may generate the abnormal arc is eliminated, thereby cutting off arcing.

The cutoff control prohibition part 5 determines the accumulation state of ions which may generate the abnormal arc, based on the cumulative number of executions of the first cutoff control. In other words, the cutoff control prohibition part 5 determines the time point when the cumulative number of executions of the first cutoff control reaches a predetermined number, as a stage where ions which may generate abnormal arc in plasma have been accumulated, and then, executes the cutoff control. It is to be noted that the first cutoff control corresponds to the cutoff control performed by the first switch circuit 5a, the third comparator circuit 5b, and the second switch circuit 5c.

The cutoff control prohibition part 5 is provided with a counter circuit 5e for counting the number of executions of the first cutoff control. The counter circuit 5e counts the number of the control signals from the second switch circuit 5c. When the value of count obtained by the counting reaches a preset number of times, the counter circuit 5e transmits to the cutoff interruption circuit 2, a control signal for executing the cutoff control.

The counter circuit 5e transmits the control signal of the cutoff control, and simultaneously clears the value of count, re-counts the number of executions of the first cutoff control, and again executes the second cutoff control at the time when the value of count reaches the present number of times. The first cutoff control of the present number of times and the second cutoff control performed subsequently are repeated, and thereby suppressing the growth of arc and eliminating the abnormal arc ions effectively.

The soft start controller 1b restarts by the soft start after the second cutoff control cuts off the output from the high-frequency power source. Then, the soft start controller subjects a forward power value to feedback control, with respect to a power command value or a voltage command value, controlling to allow the output from the high-frequency power source to be equal to the voltage command value.

The soft start after the second cutoff control outputs ramp-like power changing from zero to the power command value at a matching speed which allows the matching circuit of the matching box to sufficiently handle the outputted power, and the output is performed within a time duration which enables impedance matching without detecting the reflected power as abnormal electrical discharge by the cutoff controller. Therefore, the time duration required for the soft start can be determined depending on the magnitude of the power command value, a matching property provided in the matching circuit of the matching box, and the like. The time duration of the soft start may be set in the range from 1 ms to 10 s, for instance.

Figure 12:
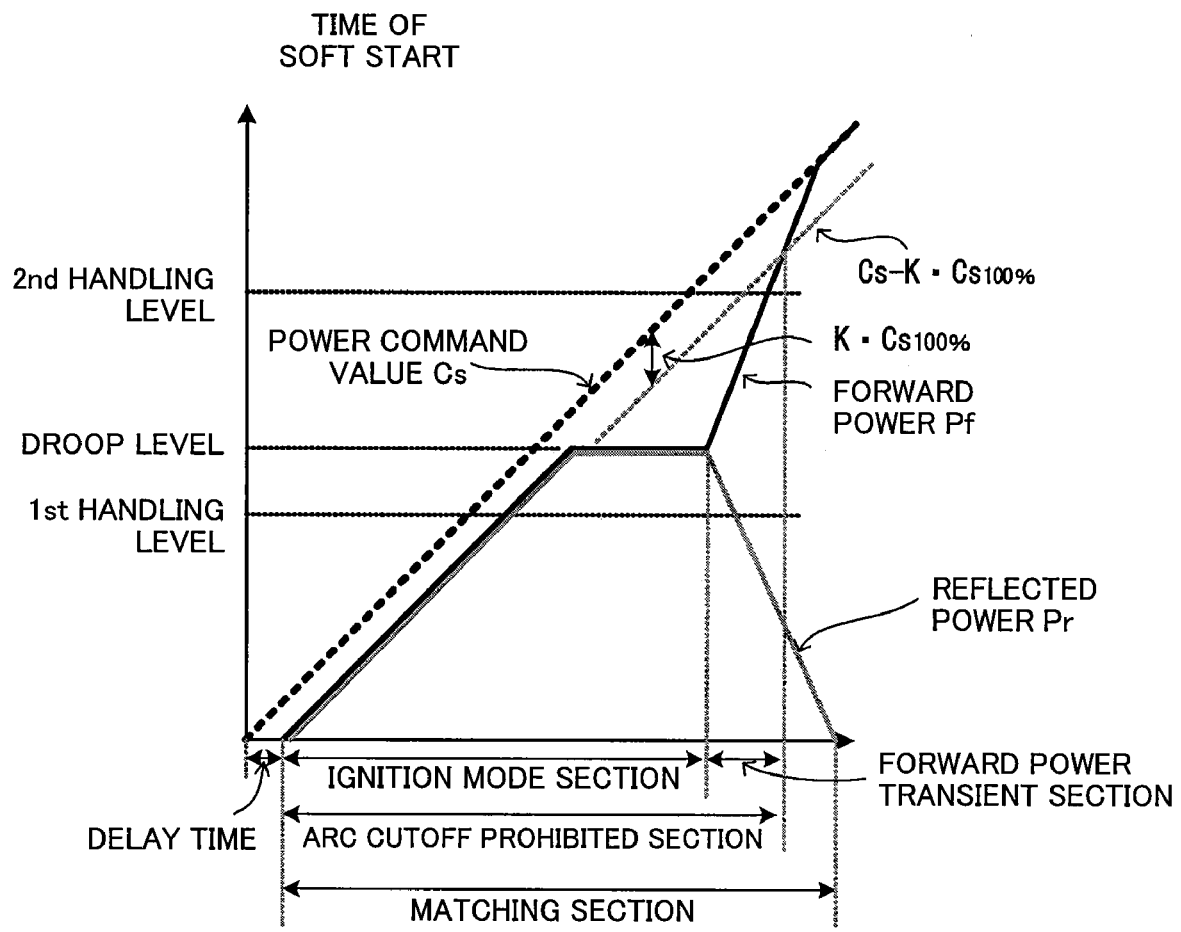
FIG. 12 illustrates an arc cutoff prohibited section at the time of soft start on a start-up point according to the present invention.
Figure 13:
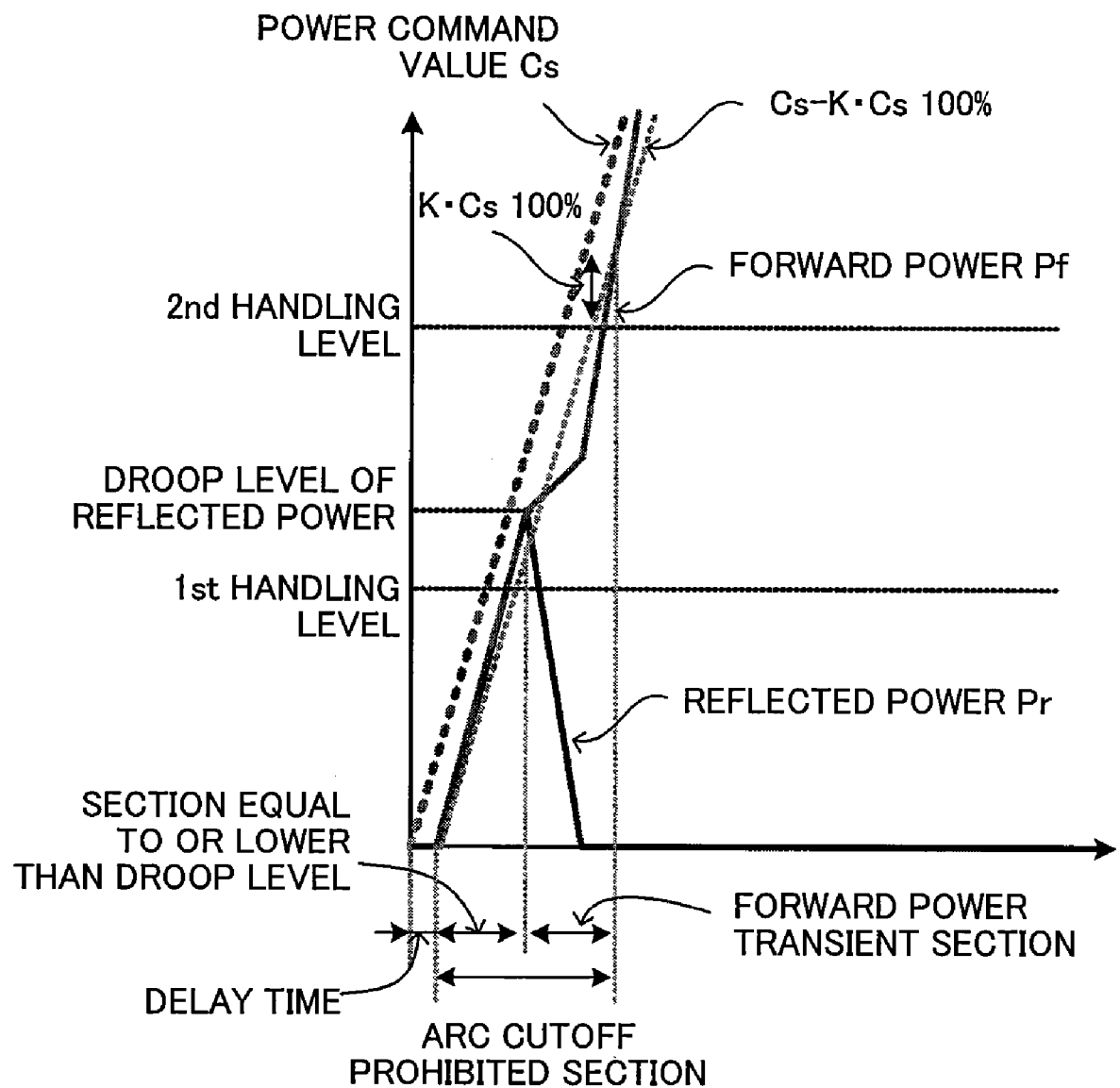
FIG. 13 illustrates an arc cutoff prohibited section at the time of high speed boot-up after the first handling cutoff according to the present invention.
Figure 14:
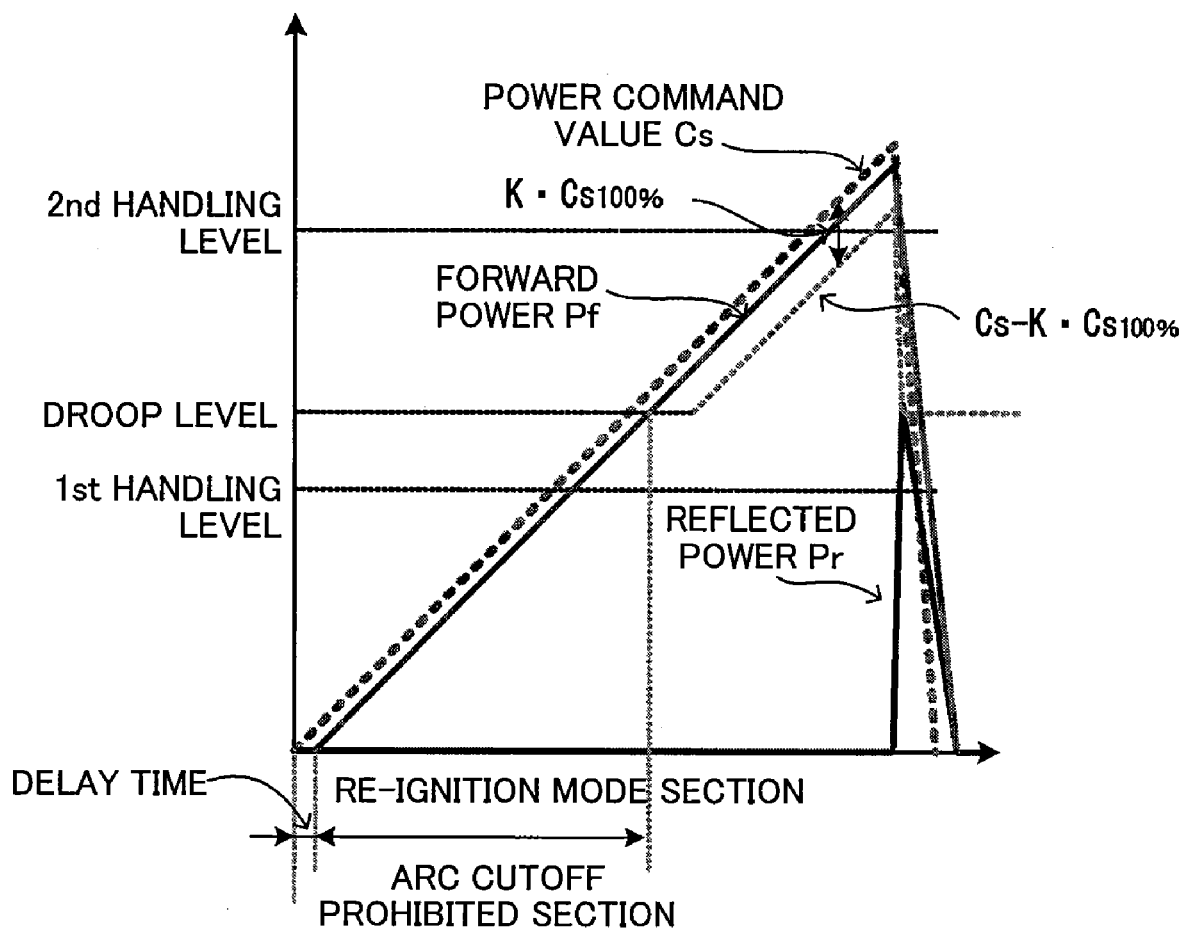
FIG. 14 illustrates an arc cutoff prohibited section at the time of soft start after the second handling cutoff according to the present invention.

Hereinafter, with reference to FIG. 12 to FIG. 14, the arc cutoff prohibited section will be explained. FIG. 12 illustrates the arc cutoff prohibited section when the soft start is executed on the initial stage; FIG. 13 illustrates the arc cutoff prohibited section at the time of high speed boot-up after the first handling cutoff; and FIG. 14 illustrates the arc cutoff prohibited section at the time of soft start after the second handling cutoff.

In FIG. 12, at the time of soft start on the initial stage, the arc cutoff prohibited section includes the ignition mode section and the forward power transient section. The ignition mode section corresponds to a range where the forward power Pf is equal to or less than the droop level of the reflected power. The droop level can be defined as "L×Cs 100%"; multiplying the command value of rated power "Cs 100%" by the reflected droop coefficient "L".

In addition, the forward power transient section corresponds to a section where the forward power Pf exceeds the droop level up to the point entering a predetermined level range defined with respect to the power command value Cs. The predetermined level range can be defined by a level range having the power command value "Cs" as an upper limit, and a value (CS−K×Cs 100%) as a lower limit; subtracting from the command value of rated power "Cs", "K×Cs 100%" multiplying the command value of rated power "Cs 100%" by the predetermined coefficient "K". In FIG. 12, the section up to the point where the reflected power Pr drops is assumed as the matching section.

In FIG. 13, at the time of high speed boot-up after the first handling cutoff, the arc cutoff prohibited section includes a section determined by the droop level and the forward power transient section.

In FIG. 14, at the time of soft start after the second handling cutoff, the re-ignition mode section is set as the arc cutoff prohibited section. The second handling cutoff is a cutoff process for allowing the abnormal arc ions to disappear. Therefore, after the lapse of the re-ignition mode section, the forward power gradually approaches the power command value without passing through the forward power transient section.

According to the embodiment of the present invention, it is possible to perform the first handling cutoff for allowing the ions within the plasma chamber to remain, and cutting off the power supply within the shortest time range (1 µsec to 100 µsec) which is required for eliminating the arcing element, and the temporary cutoff for cutting off the power supply within the time range (1 msec to 100 msec) which is required for allowing the abnormal arc ions to disappear.

According to the embodiment of the present invention, when the first handling cutoff is performed, ions are allowed to remain, and therefore a normal discharge can be generated within a reduced boot-up time after the cutoff. In addition, the temporary cutoff is performed, whose cutoff time is relatively long, thereby eliminating the abnormal arc ions and cutting off the arcing, and it is possible to stably supply power to plasma.

According to the embodiment of the present invention, the section for prohibiting the cutoff operation is provided in the matching section, and therefore it is possible to prevent a false cutoff of the power supply, due to the increase of the reflected power Pr which is not caused by the abnormal electrical discharge.

According to the embodiment of the present invention, it is possible to carry out the cutoff operations depending on a purpose of the cutoff; the cutoff operation for suppressing the abnormal electrical discharge (first handling cutoff operation) and the cutoff operation for suppressing the increase of the reflected power, which is not caused by the abnormal electrical discharge (second handling cutoff operation).

It is to be noted that the present invention is not limited to each of the embodiments as described above. It should be understood that disclosed embodiments are susceptible of changes and modifications without departing from the scope of the invention, and such changes and modification are intended to fall within the ambit of the appended claims.

Industrial Applicability

The apparatus for suppressing abnormal electrical discharge used for vacuum equipment according to the present invention is applicable not only to a film formation apparatus, but also to a field of treatment apparatus which uses plasma, such as a sputtering apparatus and an asking apparatus.

What is claimed is:

1. An apparatus for suppressing abnormal electrical discharge used for vacuum equipment which supplies power from a high-frequency power source into a plasma reaction chamber to generate plasma, the apparatus comprising,
   a power controller for controlling the high-frequency power source based on a deviation between a power command value and a power feedback value, and
   a cutoff controller for detecting reflected power or reflected wave voltage which is generated in at least any one of following timings; at a time of abnormal electrical discharge and during a transfer process to the abnormal electrical discharge within the plasma reaction chamber, and for cutting off a power supply from the high-frequency power source to the plasma reaction chamber, wherein,
   the cutoff controller comprises a first handling cutoff control and a second handling cutoff control, each having different time duration as a cutoff time,
   the first handling cutoff control exercises a control to cut off the high-frequency power source within a time duration which allows ions in the plasma reaction chamber to remain and an arcing element of minority arc to disappear, and
   the second handling cutoff exercises a control to cut off the high-frequency power source within a time duration which allows the ions to disappear, the ions of a majority arc at the time of abnormal electrical discharge.

2. The apparatus for suppressing abnormal electrical discharge used for vacuum equipment according to claim 1, wherein,
   the time duration as the cutoff time by the first cutoff control is in a range of from 1 μs to 100 μs, and the time duration as the cutoff time by the second cutoff control is in the range of 1 ms to 100 ms.

3. The apparatus for suppressing abnormal electrical discharge used for vacuum equipment according to claim 1, wherein,
   the power controller restarts by a soft start, after the first cutoff control cuts off an output from the high-frequency power source, and
   the soft start outputs a ramp output from zero to the power command value, in a duration with the same time ordering as the cutoff time of the first cutoff control.

4. The apparatus for suppressing abnormal electrical discharge used for vacuum equipment according to claim 3, wherein,
   the time duration of the soft start is in the range of 1 μs to 100 μs.

5. The apparatus for suppressing abnormal electrical discharge used for vacuum equipment according to claim 1, wherein,
   the power controller restarts by a soft start, after the second cutoff control cuts off an output from the high-frequency power source, and
   the soft start outputs a ramp output from zero to the power command value, in a duration in association with a matching speed of a matching circuit provided between the high-frequency power source and the plasma reaction chamber.

6. The apparatus for suppressing abnormal electrical discharge used for vacuum equipment according to claim 5, wherein,
   the time duration of the soft start is in the range of 1 ms to 10 s.

7. The apparatus for suppressing abnormal electrical discharge used for vacuum equipment according to claim 1, wherein,
   the cutoff controller counts the number of executions of the first cutoff control, and at a time when a value of the count reaches a preset number of times, the second cutoff control is executed.

8. The apparatus for suppressing abnormal electrical discharge used for vacuum equipment according to claim 7, wherein,
   the value of the count is cleared simultaneously with executing the second cut off control, and the number of executions of the first cutoff control is re-counted.

9. The apparatus for suppressing abnormal electrical discharge used for vacuum equipment according to claim 1, comprising a cutoff control prohibition part for prohibiting the cutoff control of the power supply performed by the cutoff controller, wherein,
   the cutoff control prohibition part prohibits, in an arc cutoff prohibited section, the cutoff control of the power supply performed by the cutoff controller, and continues the power supply.

10. The apparatus for suppressing abnormal electrical discharge used for vacuum equipment according to claim 9, wherein,
    the power controller uses a forward power value as the power feedback value, and controls the power being outputted so as to reduce a deviation between the power command value and the forward power value,
    the cutoff controller has a cutoff control including;
    a first handling cutoff control for detecting the abnormal electrical discharge by comparing the reflected power with a threshold at a low level, and for cutting off the power supply based on detecting the abnormal electrical discharge so as to suppress a minority arc, and
    a second handling cutoff control for detecting the abnormal electrical discharge by comparing the reflected power with a threshold at a high level, and for cutting off the power supply based on detecting the abnormal electrical discharge so as to suppress a majority arc, and
    the cutoff control prohibition part prohibits the cutoff control by the first handling cutoff control, in the arc cutoff prohibited section.

11. The apparatus for suppressing abnormal electrical discharge used for vacuum equipment according to claim 10, comprising,
    the arc cutoff prohibited section includes an ignition mode section until the plasma is ignited, and a forward power transient section where the forward power is increased toward the power command value.

12. The apparatus for suppressing abnormal electrical discharge used for vacuum equipment according to claim 9, comprising,
    the arc cutoff prohibited section includes an ignition mode section until the plasma is ignited, and a forward power transient section where the forward power is increased toward the power command value.

13. The apparatus for suppressing abnormal electrical discharge used for vacuum equipment according to claim 12, wherein,
    the ignition mode section is a section from a point where the forward power starts outputting power before the forward power exceeds a droop level of the reflected power.

14. The apparatus for suppressing abnormal electrical discharge used for vacuum equipment according to claim 13, wherein, the droop level corresponds to L×Cs 100%, multiplying a rated power command value Cs 100% by a reflected droop coefficient L.

15. The apparatus for suppressing abnormal electrical discharge used for vacuum equipment according to claim 12, wherein,
the forward power transient section corresponds to a section where the forward power is out of a predetermined level range that is defined by the power command value.

16. The apparatus for suppressing abnormal electrical discharge used for vacuum equipment according to claim 15, wherein,
the predetermined level range corresponds to a range having the rated power command value Cs 100% as an upper limit, and a value (Cs−K×Cs 100%) as a lower limit; subtracting K×Cs 100% obtained by multiplying the rated power command value Cs 100% by a predetermined coefficient K, from the power command value Cs.

17. The apparatus for suppressing abnormal electrical discharge used for vacuum equipment according to claim 11, wherein,
the forward power transient section corresponds to a section where the forward power is out of a predetermined level range that is defined by the power command value.

18. The apparatus for suppressing abnormal electrical discharge used for vacuum equipment according to claim 11, wherein,
the ignition mode section is a section from a point where the forward power starts outputting power before the forward power exceeds a droop level of the reflected power.

19. The apparatus for suppressing abnormal electrical discharge used for vacuum equipment according to claim 18, wherein,
the droop level corresponds to L×Cs 100%, multiplying a rated power command value Cs 100% by a reflected droop coefficient L.

20. The apparatus for suppressing abnormal electrical discharge used for vacuum equipment according to claim 17, wherein,
the predetermined level range corresponds to a range having the rated power command value Cs 100% as an upper limit, and a value (Cs−K×Cs 100%) as a lower limit; subtracting K×Cs 100% obtained by multiplying the rated power command value Cs 100% by a predetermined coefficient K, from the power command value Cs.

21. An apparatus for suppressing abnormal electrical discharge used for vacuum equipment for supplying power into a plasma reaction chamber to generate plasma for executing a film formation process, the apparatus comprising a high-frequency power source for supplying the power, wherein,
the high-frequency power source comprises,
a power controller for controlling the power being outputted, based on a deviation between a power command value and a power feedback value, and
a cutoff controller for detecting reflected power or reflected wave voltage which is generated in at least any one of following timings; at a time of abnormal electrical discharge and during a transfer process to the abnormal electrical discharge within the plasma reaction chamber, and for cutting off a power supply from the high-frequency power source to the plasma reaction chamber, wherein,
the cutoff controller comprises an arcing detection/cutoff part for detecting the abnormal electrical discharge, and a cutoff control prohibition part for prohibiting a cutoff control of the power supply performed by the arcing detection/cutoff part, and
the cutoff control prohibition part prohibits, in an arc cutoff prohibited section, the cutoff control of the power supply performed by the arcing detection/cutoff part, and continues the power supply.

22. The apparatus for suppressing abnormal electrical discharge used for vacuum equipment according to claim 21, comprising,
the arc cutoff prohibited section includes an ignition mode section until the plasma is ignited, and a forward power transient section where the forward power is increased toward the power command value.

23. The apparatus for suppressing abnormal electrical discharge used for vacuum equipment according to claim 22, wherein,
the ignition mode section is a section from a point where the forward power starts outputting power before the forward power exceeds a droop level of the reflected power.

24. The apparatus for suppressing abnormal electrical discharge used for vacuum equipment according to claim 23, wherein,
the droop level corresponds to L×Cs 100%, multiplying a rated power command value Cs 100% by a reflected droop coefficient L.

25. The apparatus for suppressing abnormal electrical discharge used for vacuum equipment according to claim 22, wherein,
the forward power transient section corresponds to a section where the forward power is out of a predetermined level range that is defined by the power command value.

26. The apparatus for suppressing abnormal electrical discharge used for vacuum equipment according to claim 25, wherein,
the predetermined level range corresponds to a range having the rated power command value Cs 100% as an upper limit, and a value (Cs−K×Cs 100%) as a lower limit; subtracting K×Cs 100% obtained by multiplying the rated power command value Cs 100% by a predetermined coefficient K, from the power command value Cs.

27. The apparatus for suppressing abnormal electrical discharge used for vacuum equipment according to claim 21, wherein,
the power controller uses a forward power value as the power feedback value, and controls the power being outputted so as to reduce a deviation between the power command value and the forward power value,
the cutoff controller has a cutoff control including;
a first handling cutoff control for detecting the abnormal electrical discharge by comparing the reflected power with a threshold at a low level, and for cutting off the power supply based on detecting the abnormal electrical discharge so as to suppress a minority arc, and
a second handling cutoff control for detecting the abnormal electrical discharge by comparing the reflected power with a threshold at a high level, and for cutting off the power supply based on detecting the abnormal electrical discharge so as to suppress a majority arc, and
the cutoff control prohibition part prohibits the cutoff control by the first handling cutoff control, in the arc cutoff prohibited section.

28. The apparatus for suppressing abnormal electrical discharge used for vacuum equipment according to claim 27, comprising, the arc cutoff prohibited section includes an ignition mode section until the plasma is ignited, and a forward power transient section where the forward power is increased toward the power command value.

29. The apparatus for suppressing abnormal electrical discharge used for vacuum equipment according to claim 28, wherein,
the ignition mode section is a section from a point where the forward power starts outputting power before the forward power exceeds a droop level of the reflected power.

30. The apparatus for suppressing abnormal electrical discharge used for vacuum equipment according to claim 29, wherein,
the droop level corresponds to L×Cs 100%, multiplying a rated power command value Cs 100% by a reflected droop coefficient L.

31. The apparatus for suppressing abnormal electrical discharge used for vacuum equipment according to claim 28, wherein,
the forward power transient section corresponds to a section where the forward power is out of a predetermined level range that is defined by the power command value.

32. The apparatus for suppressing abnormal electrical discharge used for vacuum equipment according to claim 31, wherein,
the predetermined level range corresponds to a range having the rated power command value Cs 100% as an upper limit, and a value (Cs−K×Cs 100%) as a lower limit; subtracting K×Cs 100% obtained by multiplying the rated power command value Cs 100% by a predetermined coefficient K, from the power command value Cs.

* * * * *